United States Patent
Kim

(10) Patent No.: US 6,507,055 B1
(45) Date of Patent: Jan. 14, 2003

(54) SOLID STATE IMAGE PICKUP DEVICE AND ITS MANUFACTURE

(75) Inventor: Yong Gwan Kim, Miyagi (JP)

(73) Assignee: Fuji Photo Film Co., Ltd., Nakanuma (JP)

( * ) Notice: Subject to any disclaimer, the term of this patent is extended or adjusted under 35 U.S.C. 154(b) by 85 days.

(21) Appl. No.: 09/633,265

(22) Filed: Aug. 4, 2000

(30) Foreign Application Priority Data

Aug. 11, 1999 (JP) ............................................. 11-227768
Jul. 14, 2000 (JP) ........................................ 2000-213600

(51) Int. Cl.[7] ...................... H01L 27/148; H01L 29/768
(52) U.S. Cl. ........................ 257/222; 257/232; 257/233; 257/241
(58) Field of Search ................................. 257/222, 223, 257/231–233, 241

(56) References Cited

U.S. PATENT DOCUMENTS

| 3,852,799 A | * 12/1974 | Walden ........................ 257/221 |
| 4,621,369 A | * 11/1986 | Narabu et al. ............... 257/221 |
| 5,742,081 A | *  4/1998 | Furumiya .................... 257/232 |
| 6,114,717 A | *  9/2000 | Uchiya ........................ 257/233 |

* cited by examiner

*Primary Examiner*—Gene M. Munson
(74) *Attorney, Agent, or Firm*—Arent Fox Kintner Plotkin & Kahn

(57) ABSTRACT

A solid state image pickup device is provided, that improves the transfer efficiency of charges in the horizontal charge transfer path by implementing a selectively arranged matrix of semiconductor layers with differing conductivity type, impurity concentration and orientation. Further, the solid state image pickup device prevents the lowering of the transfer efficiency of charges transferred from the vertical charge transfer path to the horizontal charge transfer path.

8 Claims, 18 Drawing Sheets

SOLID STATE IMAGE PICKUP DEVICE AND ITS MANUFACTURE

This application is based on Japanese Patent Application HEI 11-227768, filed on Aug. 11, 1999, and 2000-213600 filed on Jul. 14, 2000, the entire contents of which are incorporated herein by reference.

BACKGROUND OF THE INVENTION a) Field of the Invention

The present invention relates to a CCD solid state image pickup device and its manufacture, and more particularly to improvements on a transfer efficiency of electric charges of a solid state image pickup device to be transferred from vertical charge transfer paths to a horizontal charge transfer path.

b) Description of the Related Art

The structure of a general interline CCD solid state image pickup device will be described with reference to FIG. 13, FIGS. 14A and 14B, and FIGS. 15A and 15B.

FIG. 13 is a plan view of a general interline CCD solid state image pickup device, and FIGS. 14A and 14B are schematic cross sectional views illustrating charge transfer in a vertical charge transfer path VCCD and a horizontal charge transfer path HCCD. FIG. 14A shows the structure of the vertical charge transfer path VCCD, and FIG. 14B shows the structure of the horizontal charge transfer path HCCD. FIG. 15A is a schematic cross sectional view showing the structure of a region including a vertical charge transfer channel layer, and FIG. 15B is a schematic cross sectional view showing the structure of a horizontal charge transfer channel layer.

A solid state image pickup device A is formed, for example, in an n-type semiconductor layer 101 formed on a semiconductor substrate of silicon or the like.

In this n-type semiconductor layer 101, pixels 103, vertical charge transfer paths 105, a horizontal charge transfer path 107 and an output amplifier 111 are formed. A plurality of pixels 103 are formed on this n-type semiconductor layer 101, regularly disposed in vertical and horizontal directions.

Each pixel 103 includes a photodiode (photoelectric conversion element) 103a and a transfer gate 103b.

The photodiode 103a converts received light into electric charges and stores the electric charges.

The transfer gate 103b is a read gate which is used when electric charges stored in the photodiode 103a are read.

Along each pixel column with a plurality of pixels 103 being regularly disposed in the vertical direction, one vertical charge transfer channel region 105 is disposed which is made of, for example, an n-type semiconductor layer.

Along the lower ends of a plurality of vertical charge transfer channel layers 105, a horizontal charge transfer channel layer 107 is disposed which is made of, for example, an n-type semiconductor layer.

A p-type semiconductor layer 108 is formed surrounding the vertical charge transfer layers 105 and horizontal charge transfer channel layer 107.

As shown in FIG. 14A, the p-type semiconductor layer 108 is formed on one surface of the n-type semiconductor layer 101. The vertical charge transfer channel layer 105 is formed in this p-type semiconductor layer 108. The vertical charge transfer channel layer 105 is made of a semiconductor layer having generally a uniform n-type (first conductivity type) impurity concentration.

Two charge transfer electrodes 121 per one pixel row are formed on the vertical charge transfer channel layer 105. Voltages $\Phi 1$ to $\Phi 4$ are applied to adjacent four charge transfer electrodes 121.

The vertical charge transfer path VCCD is constituted of the vertical charge transfer channel layer 105 and charge transfer electrodes 121. Four-phase drive voltages V1 to V4 are applied to four vertical transfer electrodes adjacent in the vertical direction. With this four-phase driving, charges in the vertical charge transfer channel layer 105 are transferred toward the horizontal charge transfer channel layer 107.

As shown in FIG. 14B, the p-type semiconductor layer 108 continuous with the p-type semiconductor layer 108 shown in FIG. 14A is formed on one surface of the n-type semiconductor layer 101. The horizontal charge transfer channel layer 107 is formed in the p-type semiconductor layer 108. The horizontal charge transfer channel layer 107 is formed by disposing first and second horizontal charge transfer channel layers 107-1 and 107-2 having different n-type (first conductivity type) concentrations. The n-type impurity concentration of the first horizontal charge transfer channel layer 107-1 is higher than that of the second horizontal charge transfer channel layer 107-2. Alternatively, the second horizontal charge transfer channel layer 107-2 may be doped with first conductivity type impurities having the same concentration as the first horizontal charge transfer channel layer 107-1 and with impurities of a second conductivity type opposite to the first conductivity type. By doping the impurities of the opposite conductivity type, the effective first conductivity type impurity concentration is lowered. A potential profile of a two-stage structure having a potential barrier on the right side is repetitively formed from right to left in FIG. 14B. Two potential structures each having a potential barrier and a potential well are disposed in the horizontal direction to constitute one unit of charge transfer (hereinafter called "one packet").

A plurality of charge transfer electrodes 123 are formed on the horizontal charge transfer channel layer 107 in position alignment with the first and second horizontal charge transfer channel layers 107-1 and 107-2. A first transfer electrode 123-1 made of first layer polysilicon and a second transfer electrode 123-2 made of second layer polysilicon are alternately disposed side by side in the horizontal direction.

For example, the first transfer electrode 123-1 is formed on the first horizontal charge transfer channel layer 107-1, and the second transfer electrode 123-2 is formed on the second horizontal charge transfer channel layer 107-2.

Adjacent two charge transfer electrodes 123-1 and 123-2 are connected in common, and the next adjacent two charge transfer electrodes 123-1 and 123-2 are also connected in common. Voltages $\Phi 1$ and $\Phi 2$ are alternately applied to these common connections. This structure is repeated in the horizontal direction. With two-phase driving of $\Phi 1$ and $\Phi 2$, charges in the horizontal charge transfer channel layer 107 are transferred left in the horizontal direction.

The vertical charge transfer channel layers 105 are electrically connected to every second first horizontal charge transfer channel layers (potential well) 107-1 formed in the horizontal charge transfer channel layer 107.

As shown in FIG. 15A, the p-type semiconductor layer 108 is formed in the n-type semiconductor layer 101. The vertical charge transfer channel layer 105 is formed in the p-type semiconductor layer 108.

As shown in FIG. 15B, the p-type semiconductor layer 108 is formed in the n-type semiconductor layer 101. The horizontal charge transfer channel layer 107 is formed in the p-type semiconductor layer 108.

In FIG. 13, the p-type semiconductor layers 108 are indicated by one-dot chain lines. The p-type semiconductor layers 108 are formed in areas including the vertical charge transfer channel layers 105 and horizontal charge transfer channel layer 107 by using the same process and have the same depth and impurity concentration.

The cross section of the first horizontal charge transfer channel layer 107-1 having generally the same impurity concentration as that of the vertical charge transfer channel layer 105 is shown in FIG. 15B.

As indicated by a broken line in FIG. 14A, a deep depletion layer is formed in the vertical charge transfer channel layer under the electrodes (Φ3 and Φ4) applied with a voltage HIGH, the depletion layer extending deep to the p-type semiconductor layer 108. Another depletion layer indicated by the broken line is also formed in the vertical charge transfer channel layer under the electrodes (Φ1 and Φ2) applied with a voltage LOW in the direction toward the p-type semiconductor layer 108. However, this depletion layer is shallower than that applied with the HIGH voltage. Namely, the end of the depletion layer is shallow. By switching between the voltages HIGH and LOW to be applied to Φ1 to Φ4, charges can be transferred toward the horizontal charge transfer channel by four-phase driving.

As indicated by a broken line in FIG. 14B, a deep depletion layer extends from the first horizontal charge transfer channel 107-1 under the electrode (Φ2) applied with the voltage HIGH deep into the p-type semiconductor layer 108. Another depletion layer is relatively shallow which extends from the second horizontal charge transfer channel layer 107-2 under the electrode (Φ1) applied with the voltage LOW. By switching between the voltages HIGH and LOW to be applied to Φ1 and Φ2, charges can be transferred in the horizontal charge transfer channel in the horizontal direction (left in FIG. 14B) by two-phase driving.

As shown in FIG. 13, in the solid state image pickup device, a number of vertical charge transfer channel layer 105 are connected to the horizontal charge transfer channel layer 107. In order to efficiently transfer charges sequentially supplied from the vertical charge transfer channel layers 105 in the horizontal direction, it is important to speed up the charge transfer speed of the horizontal charge transfer channel layer 107.

For the higher charge transfer speed of the horizontal charge transfer channel layer 107, the amplitudes of voltages applied to the electrodes 123 are made large (a difference between voltages applied to Φ1 and Φ2 is made large).

However, if the amplitudes of voltages applied to the electrodes 123 are made too large (if a difference between voltages applied to Φ1 and Φ2 is made too large), the end of the depletion layer indicated by the broken line in FIG. 14B extends too deep and may reach the interface between the p-type semiconductor layer 108 and n-type semiconductor layer 101. If the end of the depletion layer reaches the interface, electrons during transfer may be pulled into the n-type semiconductor layer 101 and cannot be transferred efficiently. If the end of the depletion layer reaches near the interface although it does not reach the interface, there is a high probability that electrons enter the n-type semiconductor layer 101 by punch through.

SUMMARY OF THE INVENTION

It is an object of the present invention to improve a transfer efficiency of charges in the horizontal charge transfer channel.

According to one aspect of the present invention, there is provided a solid state image pickup device comprising: a semiconductor substrate; a semiconductor layer of a first conductivity type formed in the semiconductor substrate; a plurality of photoelectric conversion elements formed in the semiconductor layer regularly in vertical and horizontal directions; a plurality of first semiconductor layers of a second conductivity type opposite to the first conductivity type, the first semiconductor layer being formed in the semiconductor layer along a photoelectric conversion element column having the photoelectric conversion elements regularly disposed in the vertical direction, and extending in the vertical direction and protruding from the photoelectric conversion element column; a second semiconductor layer of the second conductivity type formed in the semiconductor layer, the second semiconductor layer extending in the horizontal direction and having an opposing end which is positioned near at one end of the photoelectric conversion element column of each of the first semiconductor layers and faces the one end spaced by a distance L from the one end; a horizontal charge transfer channel layer of the first conductivity type formed in the second semiconductor layer and extending in the horizontal direction; a plurality of vertical charge transfer channel layers of the first conductivity type each extending in the vertical direction in a corresponding one of the first semiconductor layers toward the horizontal charge transfer channel layer and protruding from the one end to couple the horizontal charge transfer channel layer; and a third semiconductor layer of the second conductivity type formed between the one ends and the opposing side, the third semiconductor layer of the second conductivity type having an impurity concentration lower than a higher one of impurity concentrations of the first and second semiconductor devices of the second conductivity type.

According to another aspect of the present invention, there is provided a method of manufacturing a solid state image pickup device comprising the steps of: (a) forming a first mask on a semiconductor layer of a first conductivity type formed on a principal surface of a semiconductor substrate, the first mask having a first opening extending in a horizontal direction in a plane of the principal surface; (b) forming a second semiconductor layer of a second conductivity type opposite to the first conductivity type in the semiconductor layer in a region corresponding to the first opening, by using the first mask, the second semiconductor layer extending in the horizontal direction; (c) forming a second mask on the semiconductor layer, the second mask having a plurality of second openings extending in a vertical direction in the plane of the principal surface, one end of each second opening being adjacent to a first position defined by one end of the first opening and aligned with a second position spaced from the first position by a distance Lm, the one end of each second opening facing the one end of the first opening; (d) forming a plurality of first semiconductor layers of the second conductivity type in the semiconductor layer in regions corresponding to the second openings, by using the second mask; (e) forming a horizontal charge transfer channel layer of the first conductive type in the second semiconductor layer, the horizontal charge transfer channel layer extending in the horizontal direction; (f) forming a plurality of vertical charge transfer channel layers of the first conductivity type, each of the vertical charge transfer channel layers extending in the second conductivity layer toward the horizontal charge transfer channel layer and protruding from the first position to couple the horizontal charge transfer channel layer; g) forming a third semiconductor layer of the second conductivity type in a region between the first and second positions; and (h) forming a plurality of photoelectric conversion elements regularly disposed in the vertical direction along the plurality of vertical charge transfer channel layers.

It is possible to raise a transfer speed (transfer efficiency) of charges in the horizontal charge transfer path. It is possible to prevent the transfer efficiency of charges to be transferred from the vertical charge transfer paths to the horizontal charge transfer path from being lowered.

DETAILED DESCRIPTION OF THE PREFERRED EMBODIMENTS

In this specification, a vertical charge transfer channel layer and charge transfer electrodes formed on the vertical charge transfer channel layer are collectively called a vertical charge transfer path VCCD, and a horizontal charge transfer channel layer and charge transfer electrodes formed on the horizontal charge transfer channel layer are collectively called a horizontal charge transfer path HCCD.

Prior to describing embodiments of the invention, experimental and theoretical studies made by the inventor will be described.

The inventor has thought of separately forming a first p-type semiconductor layer of the vertical charge transfer channel and a second p-type semiconductor layer of the horizontal charge transfer channel.

It can be considered that if the depth of the first p-type semiconductor layer of the vertical charge transfer channel is made deeper than that of the second p-type semiconductor layer of the horizontal charge transfer channel, the above-described problems such as punch through of charges in the horizontal charge transfer channel path can be solved.

With reference to FIGS. 1A to 3B, the structure of a solid state image pickup device will be described in which a first p-type semiconductor layer 5a of the vertical charge transfer channel has a depth different from the depth of a second p-type semiconductor layer 7a of the horizontal charge transfer channel.

Figure 1A:
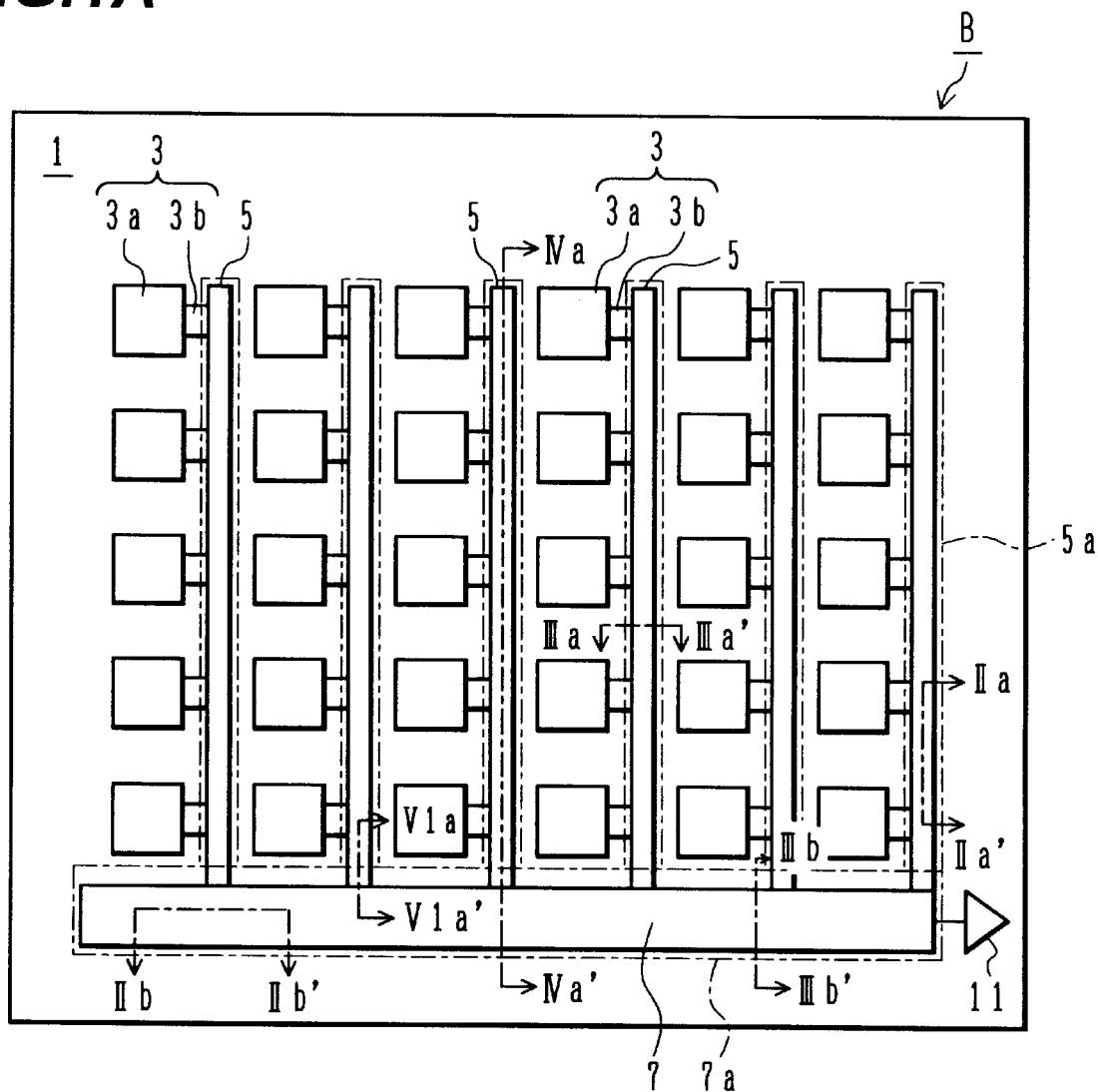
FIG. 1A is a plan view showing the outline structure of a solid state image pickup device.
Figure 1B:
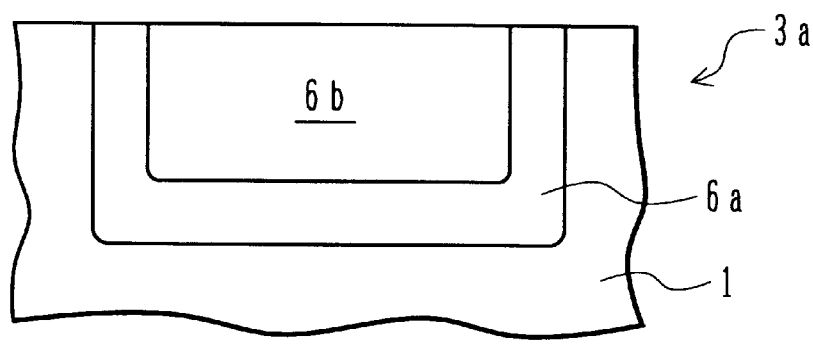
FIG. 1B is a schematic cross sectional view of a photoelectric conversion element.

FIG. 1A is a plan view showing the outline structure of a solid state image pickup device, and FIG. 1B is a cross sectional view showing the outline structure of a photoelectric conversion element of the solid state image pickup device.

Figure 2A:
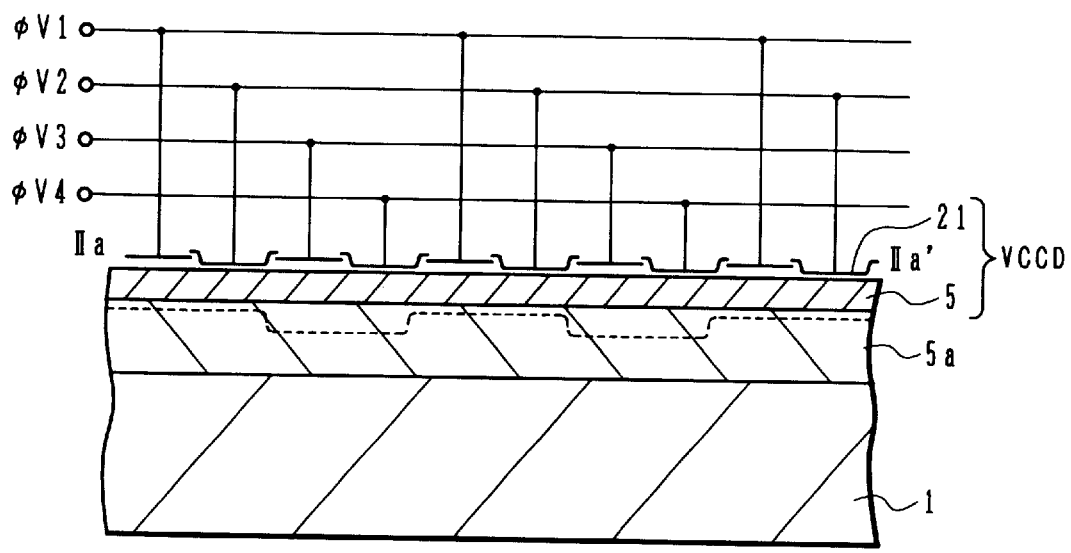
FIG. 2A is a cross sectional view showing a general structure of a vertical charge transfer path taken along line IIa–IIa' shown in FIG. 1A.
Figure 2B:
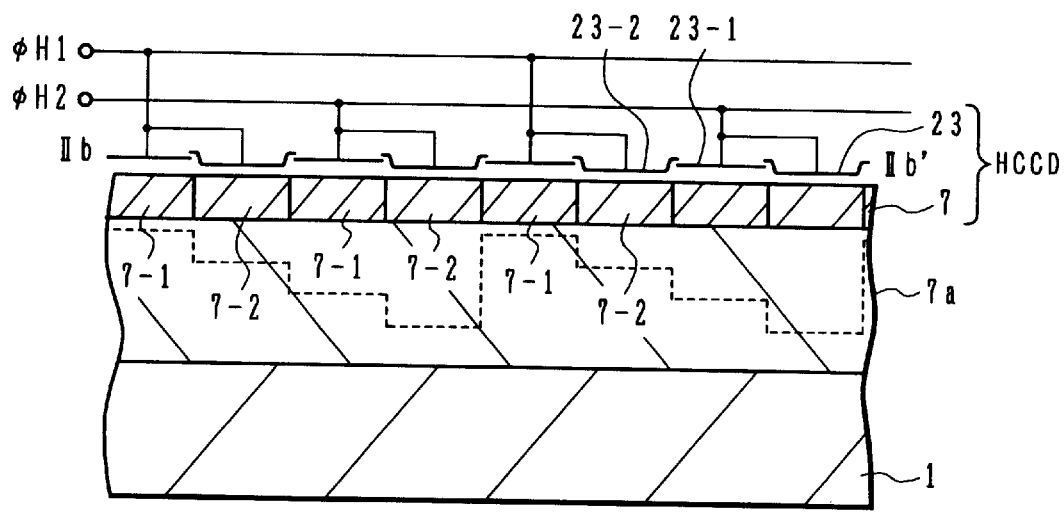
FIG. 2B is a cross sectional view showing a general structure of a horizontal charge transfer path taken along line IIb–IIb' of FIG. 1A.

FIG. 2A is a schematic cross sectional view taken along line IIa–IIa' shown in FIG. 1A, and FIG. 2B is a schematic cross sectional view taken along line IIb–IIb' shown in FIG. 1A.

Figure 3A:
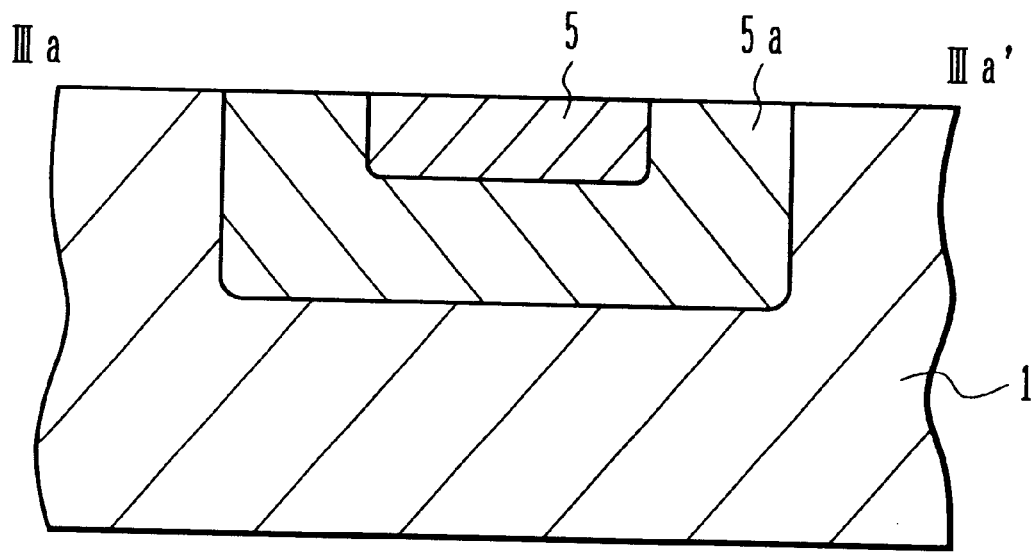
FIG. 3A is a schematic cross sectional view showing the structures of a vertical charge transfer channel layer and a first p-type semiconductor layer taken along line IIIa–IIIa' shown in FIG. 1A.
Figure 3B:
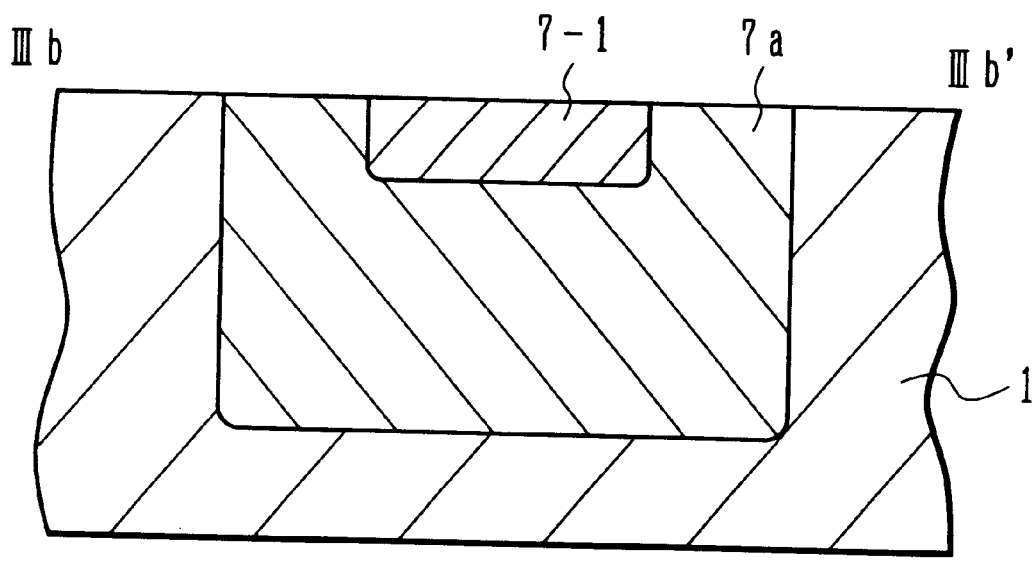
FIG. 3B is a schematic cross sectional view showing the structures of a horizontal charge transfer channel layer and a second p-type semiconductor layer taken along line IIIb–IIIb' shown in FIG. 1A.

FIGS. 3A and 3B are schematic cross sectional views respectively taken along lines IIIa–IIIa' and IIIb–IIIb' shown in FIG. 1A.

As shown in FIG. 1A, a solid state image pickup device B is formed, for example, on an n-type semiconductor layer 1 formed on a principal surface of a semiconductor substrate of silicon or the like.

The CCD solid state image pickup device B is constituted of pixels 3, vertical charge transfer channel layers 5, a horizontal charge transfer channel layer 7, an output amplifier 11 and the like, all formed in the n-type semiconductor layer 1. A plurality of pixels 3 are regularly disposed in vertical and horizontal directions on the n-type semiconductor layer 1.

Each pixel 3 includes a photodiode (photoelectric conversion element) 3a and a transfer gate 3b. The photodiode 3a converts incidence light into electric charges and stores the charges.

Along each pixel column having a plurality of pixels 3 regularly disposed in the vertical direction, each of a plurality of first p-type semiconductor layers 5a is disposed.

One ends of the first p-type semiconductor layers on the downstream side (lower side in FIG. 1A) protrude from the photoelectric conversion columns regularly disposed in the vertical direction.

The second p-type semiconductor layer 7a extending in the horizontal direction is connected to the downstream one ends of the plurality of first p-type semiconductor layers 5a.

A vertically extending n-type semiconductor layer (vertical charge transfer channel layer 5) is formed in each first p-type semiconductor layer 5a.

A transfer gate 3b is formed between each photodiode 3a and corresponding vertical charge transfer channel layer 5, the transfer gate 3b being used for reading charges stored in the photodiode 3a to the vertical charge transfer channel layer 5.

A horizontally extending horizontal charge transfer channel layer 7 is formed in the second p-type semiconductor layer 7a, contacting the downward one ends of the vertical charge transfer channel layers 5. The horizontal charge transfer channel layer 7 is made of, for example, an n-type semiconductor layer.

As shown in FIG. 1B, each photoelectric conversion element 3a includes the n-type semiconductor layer 1, a p-type semiconductor layer 6a formed in the n-type semiconductor layer 1, and an n-type semiconductor layer 6b formed in the p-type semiconductor layer 6a. A p-n junction between the p-type semiconductor layer 6a and n-type semiconductor layer 6b forms an photoelectric conversion element (photodiode).

FIG. 2A is a cross sectional view showing the structure of the vertical charge transfer path VCCD and illustrating charge transfer in the path VCCD, and FIG. 2B is a cross sectional view showing the structure of the horizontal charge transfer path HCCD and illustrating charge transfer in the path HCCD.

As shown in FIG. 2A, the first p-type semiconductor layer 5a is formed in the n-type semiconductor layer 1. The vertical charge transfer channel layer 5 is formed in the first p-type semiconductor layer 5a. The vertical charge transfer channel layer 5 is made of a semiconductor layer having generally a uniform n-type (first conductivity type) impurity concentration at a same depth.

A plurality of charge transfer electrodes 21 for transferring charges are formed on the vertical charge transfer channel layer 5. Voltages $\Phi V1$ to $\Phi V4$ are applied to adjacent four charge transfer electrodes 21.

The vertical charge transfer channel layer 5 and charge transfer electrodes 21 constitute the vertical charge transfer path VCCD for transferring charges downward.

As shown in FIG. 2B, the horizontal charge transfer channel layer 7 is formed in the second p-type semiconductor layer 7a.

The horizontal charge transfer channel layer 7 is made of alternately disposed semiconductor layers having different n-type (first conductivity type) impurity concentrations.

The n-type impurity concentration of a first horizontal charge transfer channel layer 7-1 is higher than that of a second horizontal charge transfer channel layer 7-2 next to the layer 7-1. Alternatively, the second horizontal charge transfer channel layer 7-2 may be doped with first conductivity type impurities having the same concentration as the first horizontal charge transfer channel layer 7-1 and with p-type (second conductivity type) impurities. By doping the impurities of the opposite conductivity type, the effective first conductivity type impurity concentration of the second horizontal charge transfer channel layer 7-2 is lowered. A plurality of charge transfer electrodes 23 for transferring charges are formed on the horizontal charge transfer channel layer 7. A first charge transfer electrode 23-1 made of, e.g., first layer polysilicon is formed on the first horizontal charge transfer channel layer 7-1, and a second charge transfer electrode 23-2 made of, e.g., second layer polysilicon is formed on the second horizontal charge transfer channel layer 7-2. Two of the first and second charge transfer electrodes 23-1 and 23-2 are connected in common and a voltage $\Phi H1$ is applied to the common connection. Two of the first and second charge transfer electrodes 23-1 and 23-2 adjacent to the commonly connected first and second charge transfer electrodes are also connected in common and a voltage $\Phi H2$ is applied to this common connection. The horizontal charge transfer channel layer 7 and charge transfer electrodes 23 constitute the horizontal charge transfer path HCCD for transferring charges in the horizontal direction.

As shown in FIG. 3A, the first p-type semiconductor layer 5a is formed in the n-type semiconductor layer 1. The vertical charge transfer channel layer 5 is formed in the first p-type semiconductor layer 5a.

As shown in FIG. 3B, the second p-type semiconductor layer 7a is formed in the n-type semiconductor layer 1. The horizontal charge transfer channel layer 7 is formed in the second p-type semiconductor layer 7a.

The second p-type semiconductor layer 7a is formed deeper than the first p-type semiconductor layer 5a.

As described earlier, the horizontal charge transfer channel layer 7 is made of alternately disposed first and second horizontal charge transfer channel layers 7-1 and 7-2. In FIG. 3B, the first horizontal charge transfer channel layer 7-1 is shown.

Next, with reference to FIGS. 2A and 2B, the operation of the vertical charge transfer path VCCD and horizontal charge transfer path HCCD will be described.

As shown in FIG. 2A, drive pulse signals $\Phi V1$ to $\Phi V4$ are applied to adjacent four charge transfer electrodes 21 of the vertical charge transfer path VCCD.

Namely, the four-phase drive pulse signals $\Phi V1$ to $\Phi V4$ each having a phase shift of $\pi/2$ are applied to one set of adjacent four charge transfer electrodes 21.

As shown by a broken line in FIG. 2A, a relatively deep depletion layer extending from the vertical charge transfer channel layer 5 and entering the p-type semiconductor layer 5a is formed under the electrodes ($\Phi V3$ and $\Phi V4$) applied with a voltage HIGH.

Another depletion layer formed under the electrodes ($\Phi V1$ and $\Phi V2$) applied with a voltage LOW is relatively shallow. By switching between the voltages HIGH and LOW to be applied to the electrodes $\Phi V1$ to $\Phi V4$, charges can be transferred toward the horizontal charge transfer channel by four-phase driving.

As shown in FIG. 2B, drive pulse signals $\Phi H1$ and $\Phi H2$ are applied to the charge transfer electrodes 23 of the horizontal charge transfer path HCCD. More specifically, the drive pulse signal $\Phi H1$ is applied to a pair of commonly connected first and second charge transfer electrodes 23-1 and 23-2. Similarly, the drive pulse signal $\Phi H2$ is applied to another pair of commonly connected first and second charge transfer electrodes 23-1 and 23-2 adjacent to the former pair.

The n-type impurity concentration of the first horizontal charge transfer channel layer 7-1 is higher than that of the second horizontal charge transfer channel layer 7-2. Therefore, the depletion layer extending in the region under the commonly connected second charge transfer electrode 23-2 is deeper than that in the region under the commonly connected first charge transfer electrode 23-1, at the same voltage level.

In addition, the end of the depletion layer indicated by the broken line extends deep into the second p-type semiconductor layer 7a, in the region under the electrode (ΦH2) applied with the voltage HIGH. The end of the depletion layer is shallow in the region under the electrode (ΦH1) applied with the voltage LOW.

By switching between the voltages HIGH and LOW to be applied to the electrodes ΦH1 and ΦH2, charges can be transferred in the horizontal charge transfer channel by two-phase driving.

For a higher charge transfer speed of the horizontal charge transfer channel layer 7, the amplitudes of voltages applied to the electrodes 23 are made large (a difference between voltages applied to ΦH1 and ΦH2 is made large).

If the amplitudes of voltages are made large, the depth of the end of the depletion layer indicated by the broken line becomes deep. However, since the second p-type semiconductor layer 7a of the horizontal charge transfer channel is made deep, a possibility that the end of the depletion layer extends near to the interface between the second p-type semiconductor layer 7a and first semiconductor layer 1 is small even if the amplitudes of voltages are made large. It is therefore possible to apply a high voltage to the charge transfer electrodes 23. Even if electrons are transferred at high speed, a possibility that the electrons during transfer enter the n-type semiconductor layer 1 can be lowered.

In the solid state image pickup device having the structure shown in FIGS. 1A to 3B, a transfer speed of charges in the horizontal charge transfer channel layer can be increased.

Solid state image pickup devices having the structure shown in FIGS. 1A to 3B were manufactured and their characteristics were evaluated. It was found that the problem of a lowered charge transfer efficiency occurred often.

From the viewpoint of a lowered charge transfer efficiency, the inventor has further studied manufacture processes for a solid state image pickup device.

FIGS. 4A to 4D are cross sectional views illustrating the main manufacture processes for the solid state image pickup device having the structure shown in FIGS. 1A to 3B, as taken along line IVa–IVa' shown in FIG. 1A.

Figure 4A:
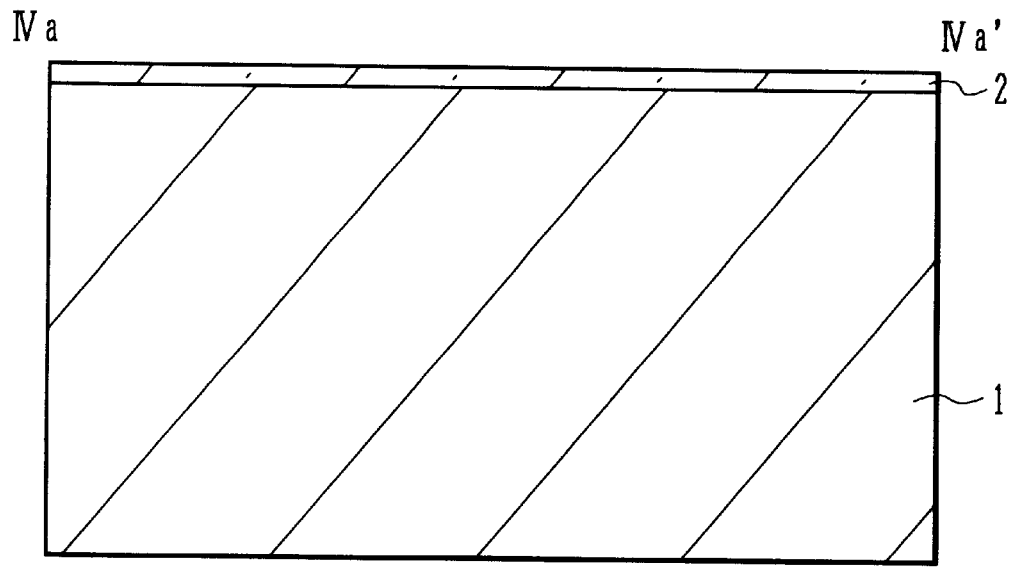
FIGS. 4A to 4D are cross sectional views illustrating the manufacture processes for a solid state image pickup device.

As shown in FIG. 4A, on a n-type semiconductor layer 1 formed on a semiconductor substrate, a surface oxide film 2, e.g., an $SiO_2$ film, is formed by thermal oxidation. The thickness of the surface oxide film 2 is in a range from 10 nm to 20 nm.

Figure 4B:
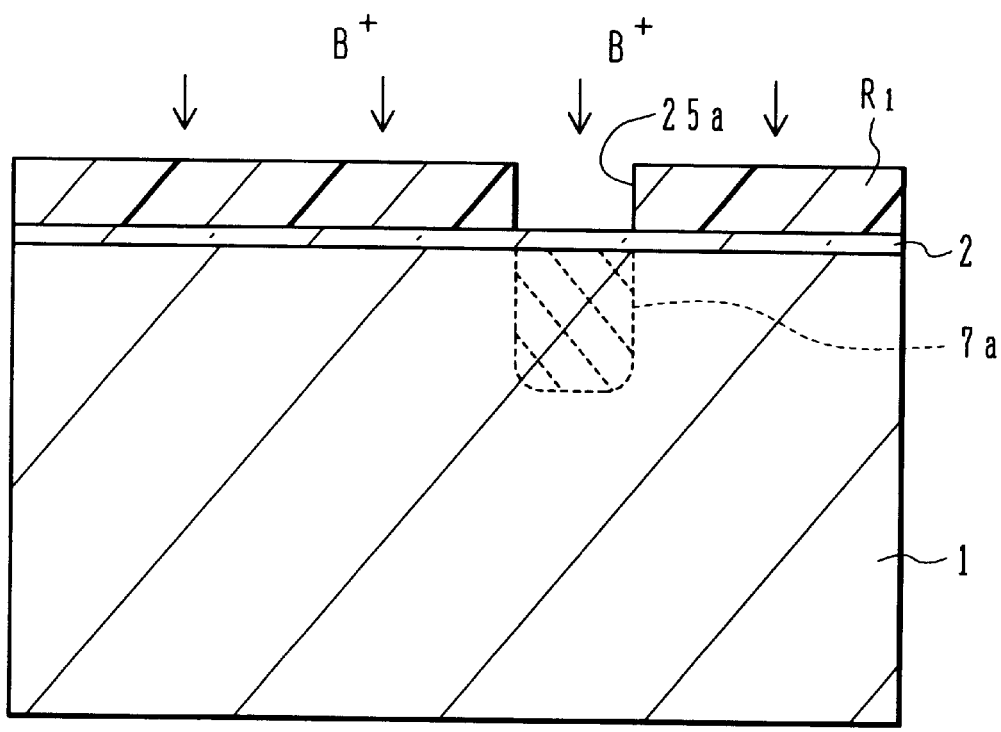

As shown in FIG. 4B, a first resist mask RI having a first opening 25a is formed by photolithography.

By using the first resist mask R1, p-type impurity ions, e.g., $B^+$, are implanted into the n-type semiconductor layer 1 via the first opening 25a at a high ion implantation energy to form a deep p-type semiconductor layer (second p-type semiconductor layer) 7a indicated by a broken line.

Figure 4C:
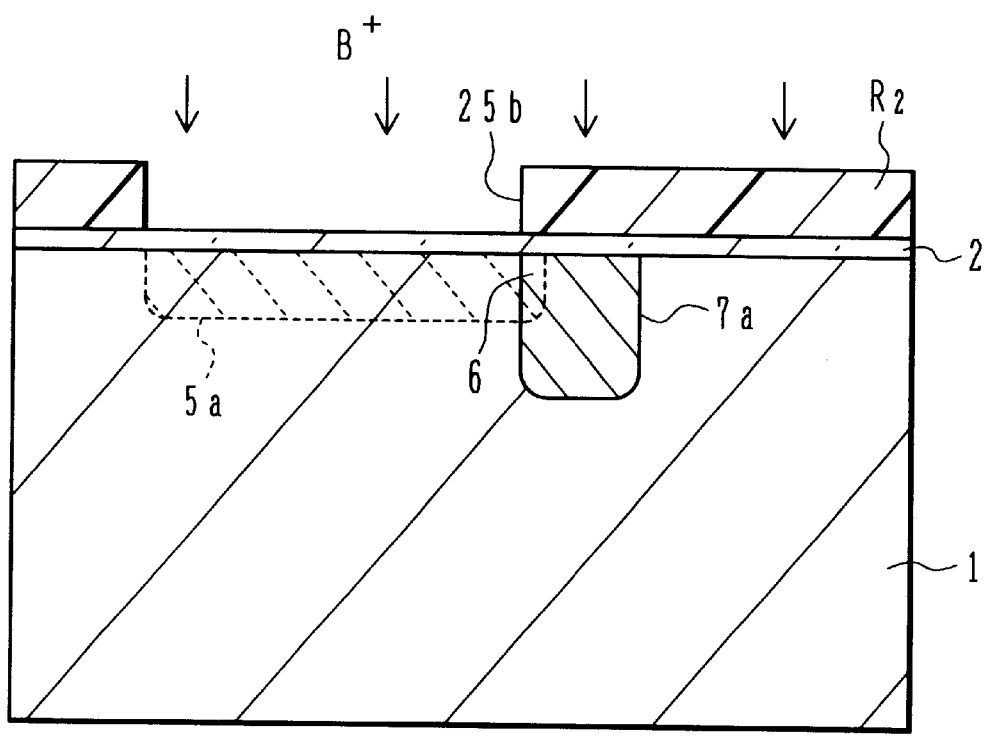

As shown in FIG. 4C, after removing the first resist mask R1, a second resist mask R2 having a second opening 25b is formed by photolithography. The second opening 25b is formed so that one end of the second opening 25b is flush with one end of the second p-type semiconductor layer 7a.

By using the second resist mask R2, p-type impurity ions, e.g., $B^+$, are implanted into the n-type semiconductor layer 1 via the second opening 25b at an ion implantation energy lower than the energy for the second p-type semiconductor layer 7a, to form a relatively shallow p-type semiconductor layer (first p-type semiconductor layer) 5a indicated by a broken line. The first and second p-type semiconductor layers 5a and 7a are coupled at their one ends.

Figure 4D:
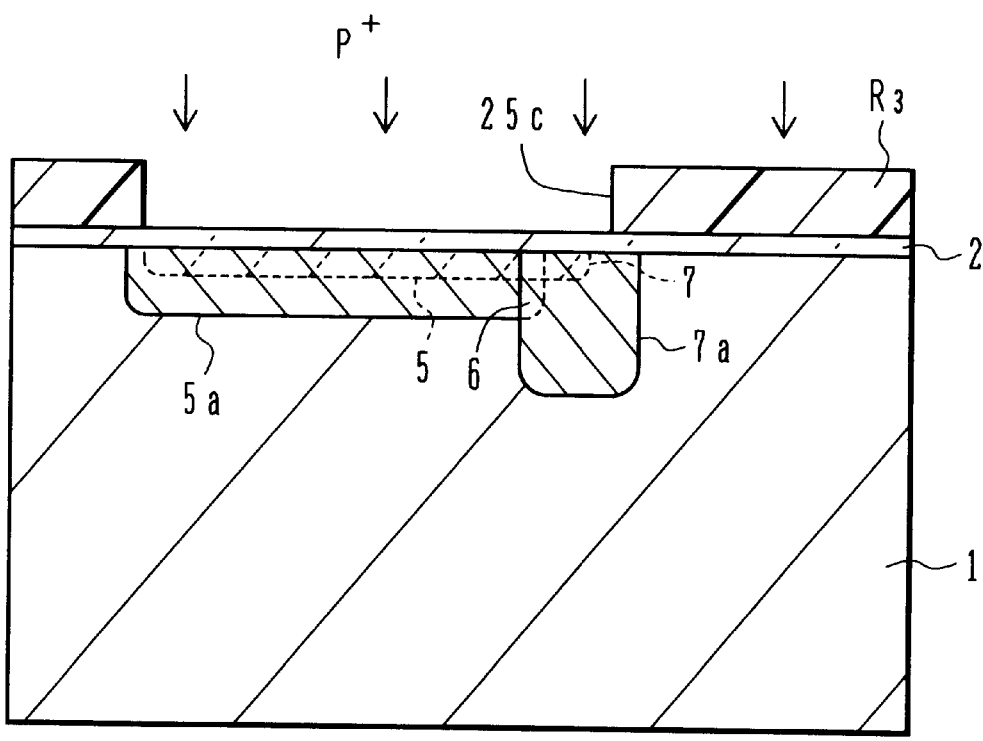

As shown in FIG. 4D, after removing the second resist mask R2, a third resist mask R3 having a third opening 25c is formed by photolithography. The third opening 25c is formed so that it partially covers both the first and second p-type semiconductor layers 5a and 7a.

By using the third resist mask R3, n-type impurity ions, e.g., $P^+$ or $As^+$, are implanted into the p-type semiconductor layers 5a and 7a via the third opening 25c.

Continuous n-type semiconductor layers 5 and 7 are therefore formed in the first and: second p-type semiconductor layers 5a and 7a, being shallower than the these layers 5a and 7a.

The n-type semiconductor layer 5 constitutes the vertical charge transfer channel layer, whereas the n-type semiconductor layer 7 constitutes the horizontal charge transfer channel layer or a vertical charge transfer channel layer extended into the horizontal charge transfer channel layer.

There is a general tendency that as p-type impurity ions are implanted, they diffuse in a lateral direction, and as activation annealing is performed thereafter, the implanted ions further diffuse in the lateral direction. In addition, there may be a position misalignment when the second resist mask R2 is formed.

The inventor has thought of a possibility of an overlap region 6 between the first and second p-type semiconductor layers 5a and 7a near at their coupling area shown in FIG. 4C.

Figure 5:
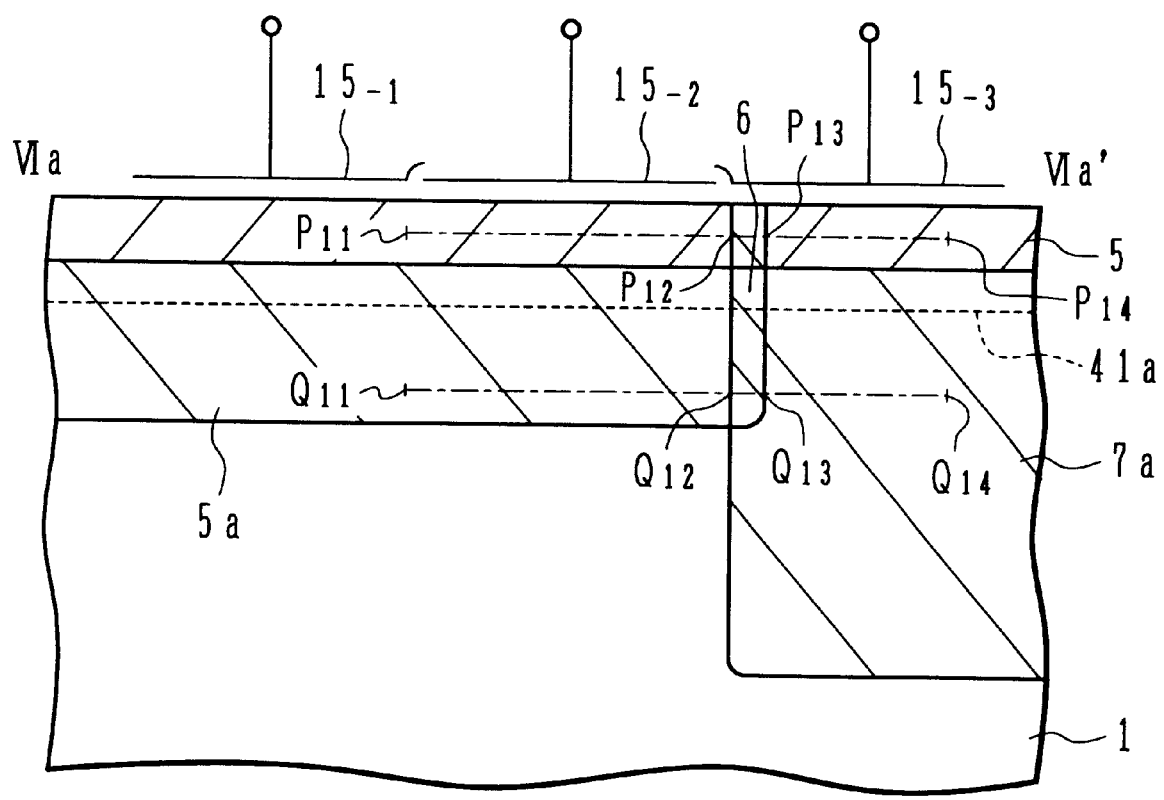
FIG. 5 is a cross sectional view showing the structure of a coupling region between the first and second p-type semiconductor layers of a solid state image pickup device manufactured by the processes shown in FIGS. 4A to 4D.

FIG. 5 is a cross sectional view taken along line VIa–VIa' of FIG. 1A and showing the main structure of a coupling area between the vertical charge transfer channel 5 and horizontal charge transfer channel 7 of a solid state image pickup device manufactured by the above-described processes.

Figure 6A:
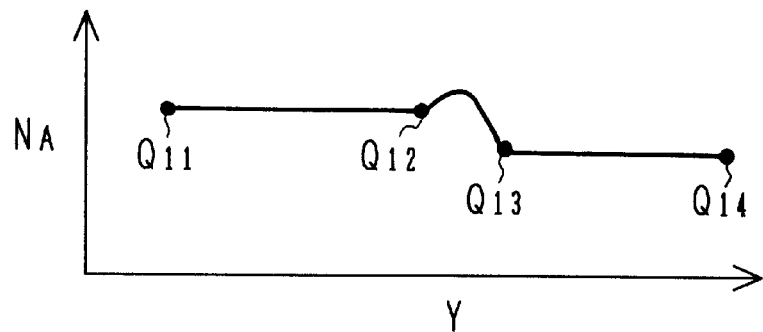
FIG. 6A shows a profile of a p-type impurity concentration along line Q11–Q14 shown in FIG. 5.
Figure 6B:
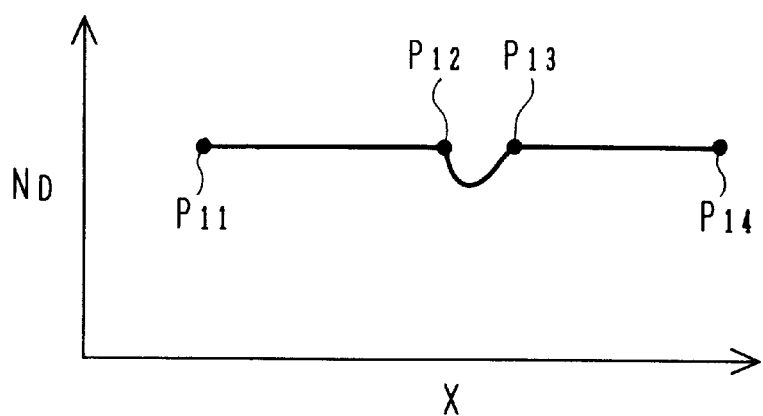
FIG. 6B shows a profile of an n-type impurity concentration along line P11–P14 shown in FIG. 5.
Figure 6C:
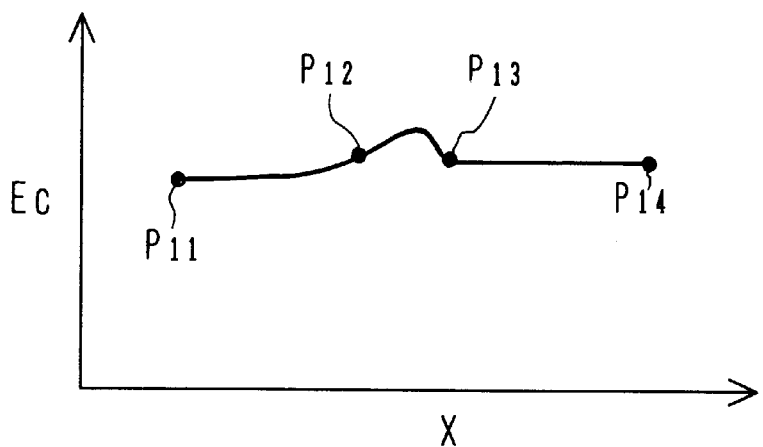
FIG. 6C shows a profile of a conduction band end Ec along line P11–P14 shown in FIG. 6C.

FIG. 6A is a schematic diagram showing a change in a p-type impurity concentration of the p-type semiconductor layers 5a and 7a along a line from Q11 to Q14 shown in FIG. 5. FIG. 6B is a schematic diagram showing a change in an n-type impurity concentration of the p-type semiconductor layer 5 along a line from P11 to P14 shown in FIG. 5. FIG. 6C is a schematic diagram showing a change in the conduction band end Ex in the vertical charge transfer channel layer 5 along a line from P11 to P14 shown in FIG. 5.

As shown in FIG. 6A, the overlap region 6 (from Q12 to Q13) has a higher p-type impurity concentration because the p-type impurity concentrations of the first and second p-type semiconductor layers 5a and 7a are added together.

As shown in FIG. 6B, the overlap region (from P12 to P13) has a lower effective n-type impurity concentration in the vertical charge transfer channel layer 5 because of the high p-type impurity concentration shown in FIG. 6A from Q12 to Q13.

As shown in FIG. 6C, the energy at the conduction band end in the overlap region (from P12 to P13) becomes high and a potential barrier of electrons is formed from P12 to P13. This potential barrier of electrons may result in a lowered electron transfer efficiency from the vertical charge transfer channel 5 to horizontal charge transfer channel 7.

From these experimental and theoretical studies, the inventor proposes a solid state image pickup device and its manufacture method described in the following.

In the processes shown in FIGS. 4B and 4C, when the second resist mask R2 for p-type impurity ion implantation is formed after the second p-type semiconductor layer 7a is formed, one end of the second opening 25b of the second resist mask R2 near one end of the second semiconductor layer 7a is spaced from this one end by a distance L. In this state, ion implantation is performed so that the overlap region between the first and second p-type semiconductor layers 5a and 7a are hard to be formed. It can therefore be expected that the potential barrier of electrons shown in FIG. 6C is not likely to be formed.

A solid state image pickup device and its manufacture method according to embodiments of the invention proposed from the above-described studies will be described.

A solid state image pickup device according to an embodiment of the invention will be described with reference to FIG. 7A to FIG. 12.

FIGS. 7A to 7E are cross sectional views showing the main manufacture processes for a solid image pickup device, and FIGS. 8A to 8D are plan views corresponding to the cross sectional views of FIGS. 7B to 7E taken along line VIII—VIII'.

The plan views shown in FIGS. 8A to 8D show only an area of one chip of a solid state image pickup device. A number of such patterns are formed on a semiconductor substrate.

Figure 7A:
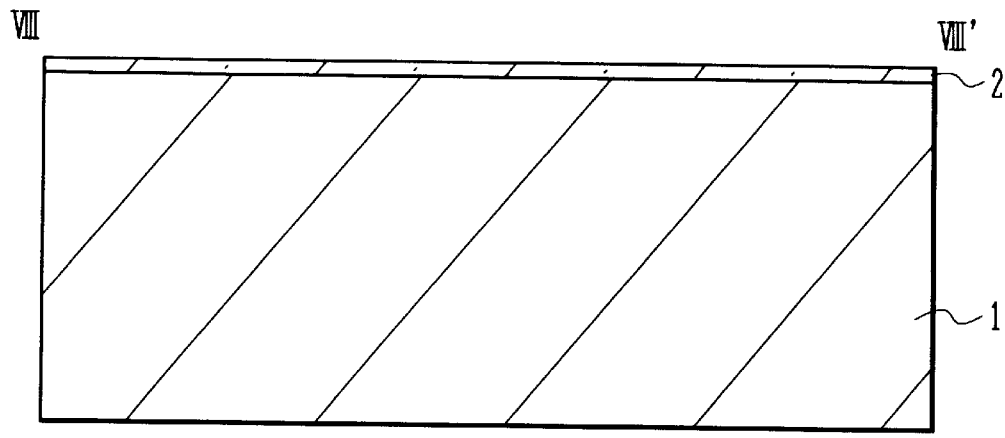
FIGS. 7A to 7E are cross sectional views illustrating the manufacture processes for a solid state image pickup device according to an embodiment.

As shown in FIG. 7A, on an n-type semiconductor layer 1 of a silicon semiconductor substrate, a surface oxide film 2, e.g., an $SiO_2$ film, is formed by thermal oxidation. The thickness of the surface oxide film is, for example, in a range from 10 nm to 20 nm.

Figure 7B:
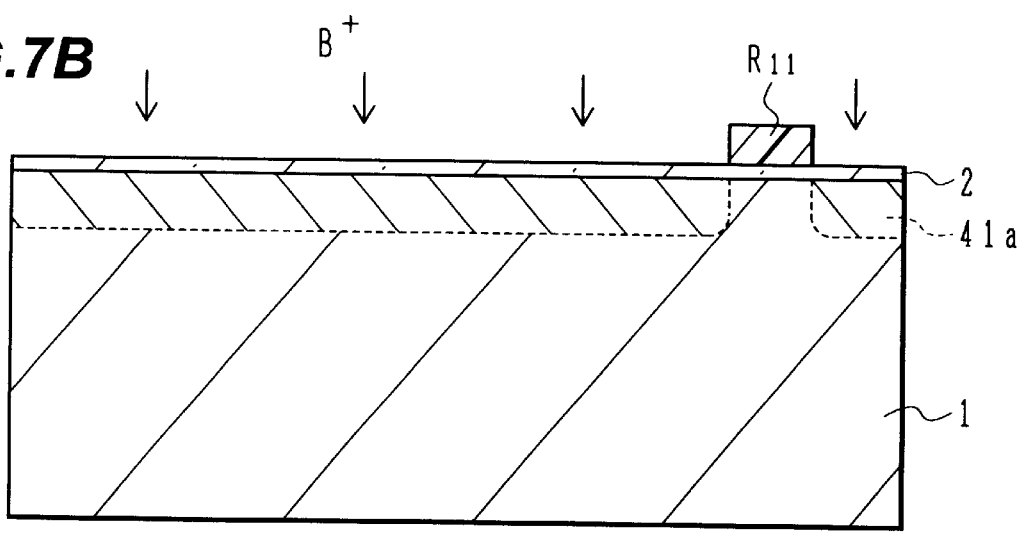
Figure 8A:
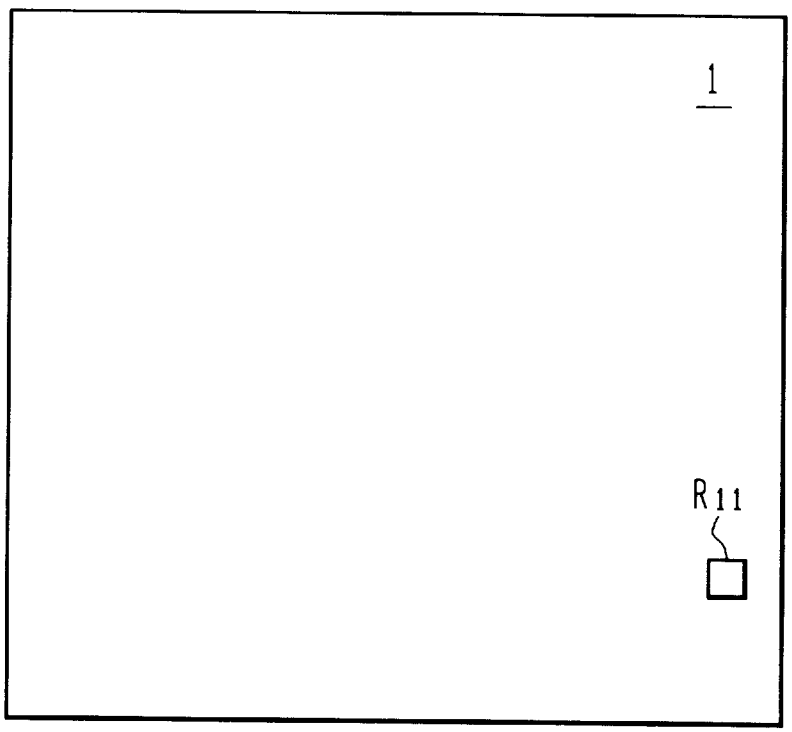
FIGS. 8A and 8B are plan views illustrating the manufacture processes for the solid state image pickup device of the embodiment, and correspond to 7B and 7C.

As shown in FIGS. 7B and 8A, a first resist mask R11 is formed by photolithography. An area covered with the first resist mask R1 is, for example, an area where a peripheral circuit such as an output amplifier is formed.

By using the first resist mask R11, p-type impurity ions, e.g., $B^+$, are implanted into the n-type semiconductor layer 1 through the surface oxide film 2.

This ion implantation process is performed at a low acceleration energy, for example, $B^+$ ions are implanted at an acceleration energy of about 80 keV.

A shallow p-type semiconductor layer (third p-type semiconductor layer) 41a indicated by a broken line in FIG. 7B is therefore formed.

This ion implantation process is called a first ion implantation process.

With this first ion implantation process, the shallow third p-type semiconductor layer 41a is formed in an area other than the area where the peripheral circuit such as an output amplifier is formed.

Figure 7C:
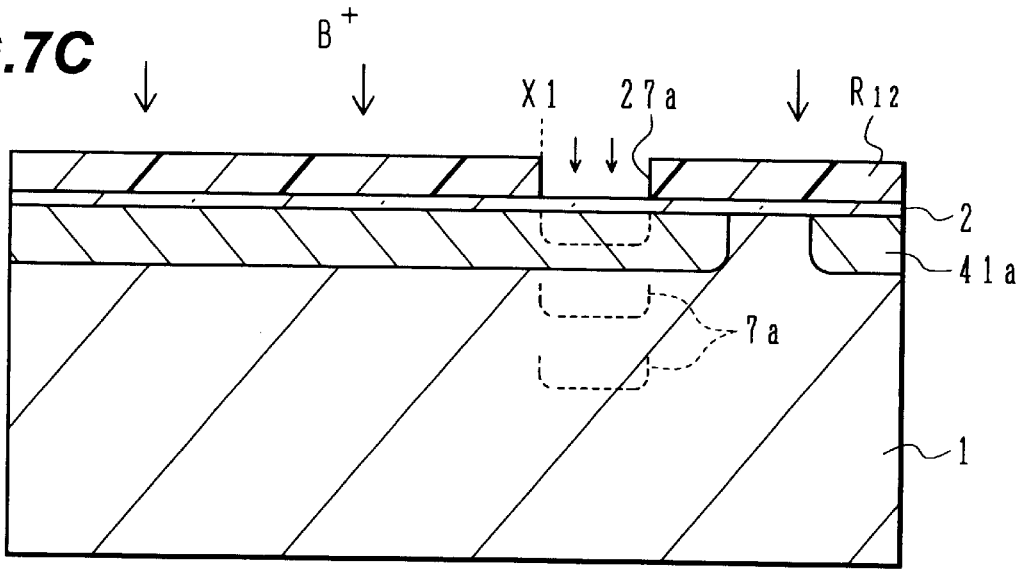
Figure 8B:
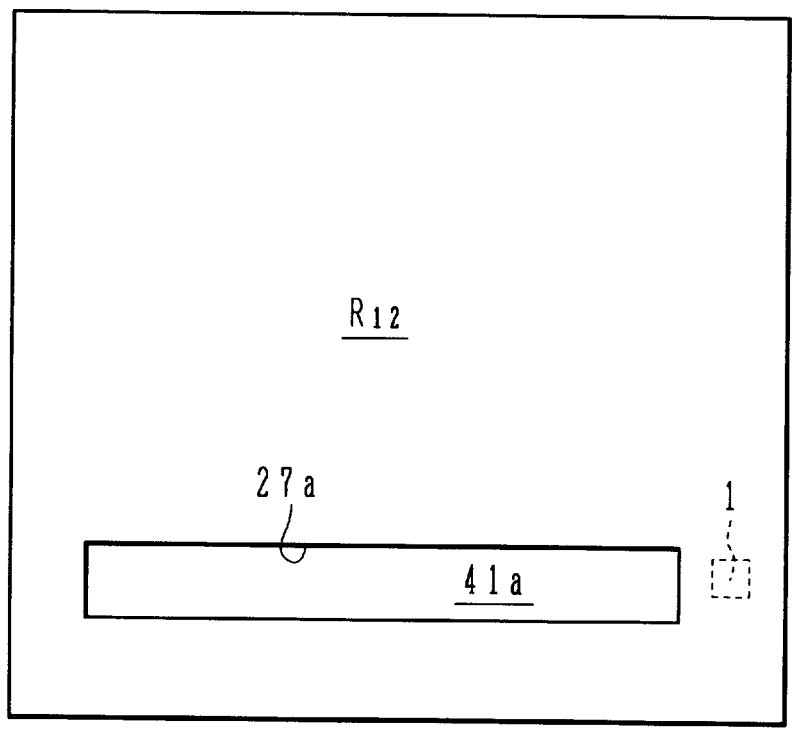

Next, as shown in FIGS. 7C and 8B, a second resist mask R12 having a first opening 27a is formed by photolithography. The first opening 27a extends in the horizontal direction as shown in FIG. 8B (is formed along a horizontal charge transfer path to be later formed), and has a stripe shape.

By using the second resist mask R12, p-type impurity ions, e.g., $B^+$, are implanted into the n-type semiconductor layer 1 via the first opening 27a.

This ion implantation process is called a second ion implantation process. With the second ion implantation process, a deep second p-type semiconductor layer 7a is formed.

The second ion implantation process is preferably performed by a plurality of ion implantation processes, e.g., three ion implantation processes, by changing the ion acceleration energy E (eV) and dose DS ($cm^{-2}$). In the three ion implantation processes of the second ion implantation process, the higher the acceleration energy, the larger the dose is set.

For example, the B ion implantation conditions are a dose DS1 of $2 \times 10^{11}$ $cm^{-2}$ and an acceleration energy E1 of 180 keV at the first time of ion implantation, a dose DS2 of $3 \times 10^{11}$ $cm^{-2}$ and an acceleration energy E2 of 600 keV at the second time of ion implantation, and a dose DS3 of $1 \times 10^{12}$ $cm^{-2}$ and an acceleration energy E3 of 2 MeV at the third time of ion implantation.

The final p-type impurity concentration profile is basically a sum of the impurity concentration profiles of the three ion implantation processes. With the second ion implantation process including three ion implantation processes at different acceleration energies, an impurity concentration profile having three peaks is formed. The deeper each of these three peaks, the higher impurity concentration it has.

An effective depth of the second p-type semiconductor layer 7a formed by the second ion implantation process is 2 $\mu$m. The effective depth of the second p-type semiconductor layer 7a is intended to mean the peak position of the impurity ion concentration formed by the highest acceleration energy E3. The effective depth of each of other semiconductor layers formed through ion implantation is also defined by the peak position.

Figure 7D:
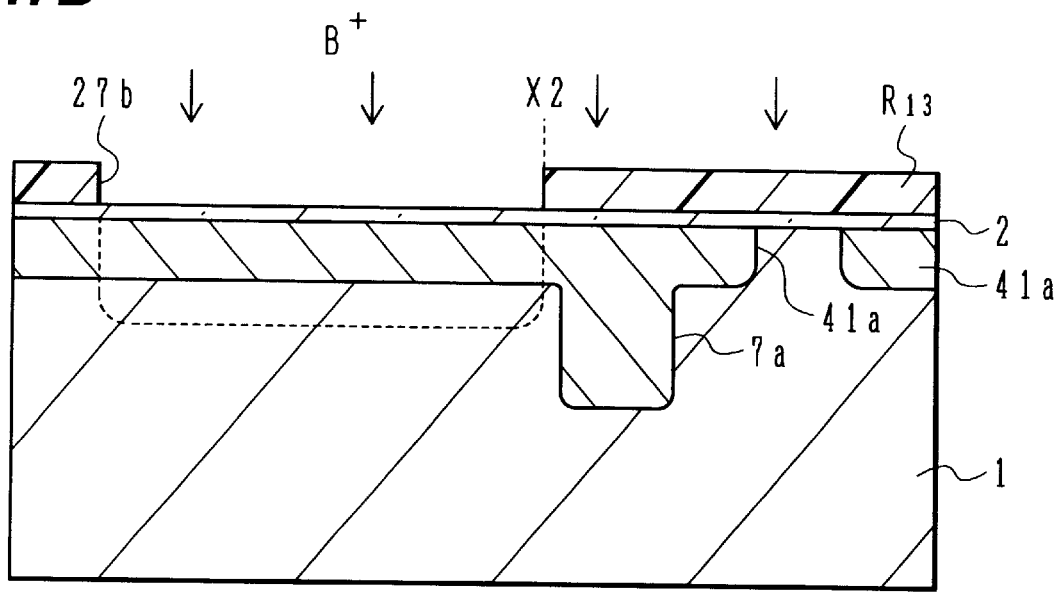
Figure 8C:
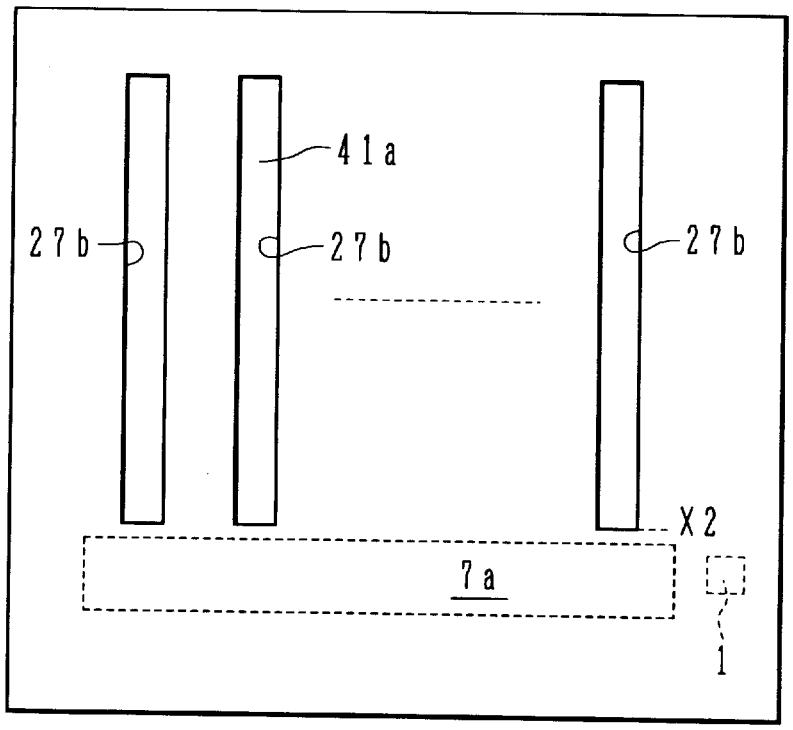
FIGS. 8C and 8D are plan views illustrating the manufacture processes for the solid state image pickup device of the embodiment, and correspond to FIGS. 7D and 7E.

Next, as shown in FIGS. 7D and 8C, a third resist mask R13 having a second opening 27b is formed by photolithography. A position (first position) x1 shown in FIG. 7C of one end of the first opening 27a on the side of a first p-type semiconductor layer 5a to be formed by a process shown in FIG. 7D is spaced by a distance Lm from a position (second position) x2 of one end of the second opening 27b on the side of the second p-type semiconductor layer 7a. This distance Lm can be preset when the photomasks for the resist masks R12 and R13 are designed.

By using the third resist mask R13, p-type impurity ions, e.g., $B^+$, are implanted into the n-type semiconductor layer 1 via the second opening 27b. This ion implantation is called a third ion implantation process. A relatively shallow p-type semiconductor layer (first p-type semiconductor layer) 5a is therefore formed as indicated by a broken line in FIG. 9D.

For example, the ion implantation conditions for the first p-type semiconductor layer 5a are a dose of $1 \times 10^{12}$ $cm^{-2}$ and an acceleration energy of 600 keV. The effective depth (peak position of the impurity concentration) of the first p-type semiconductor layer 5a formed by the third ion implantation process is about 0.6 $\mu$m.

Figure 7E:
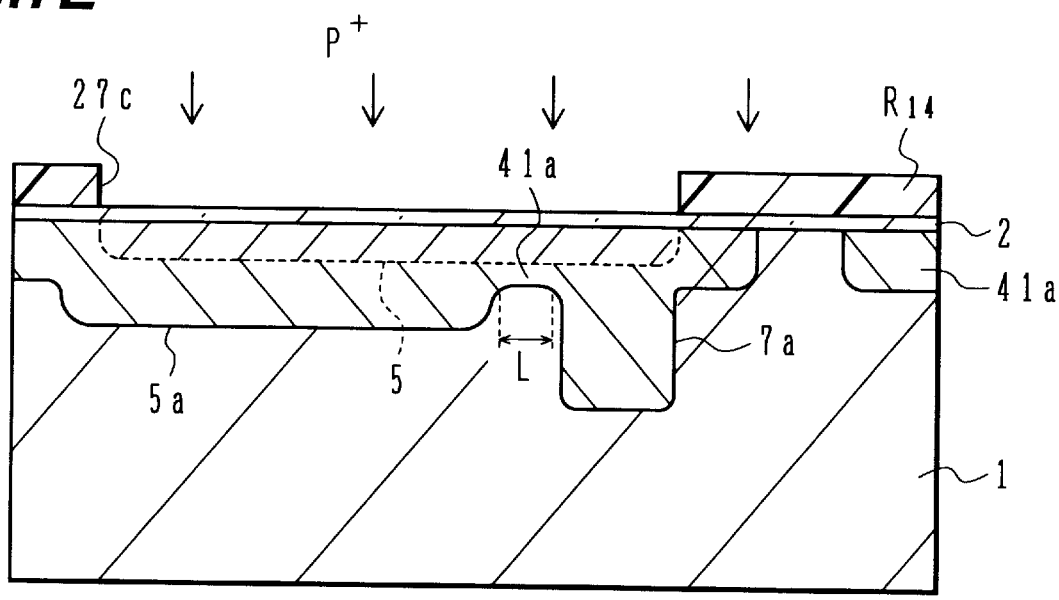
Figure 8D:
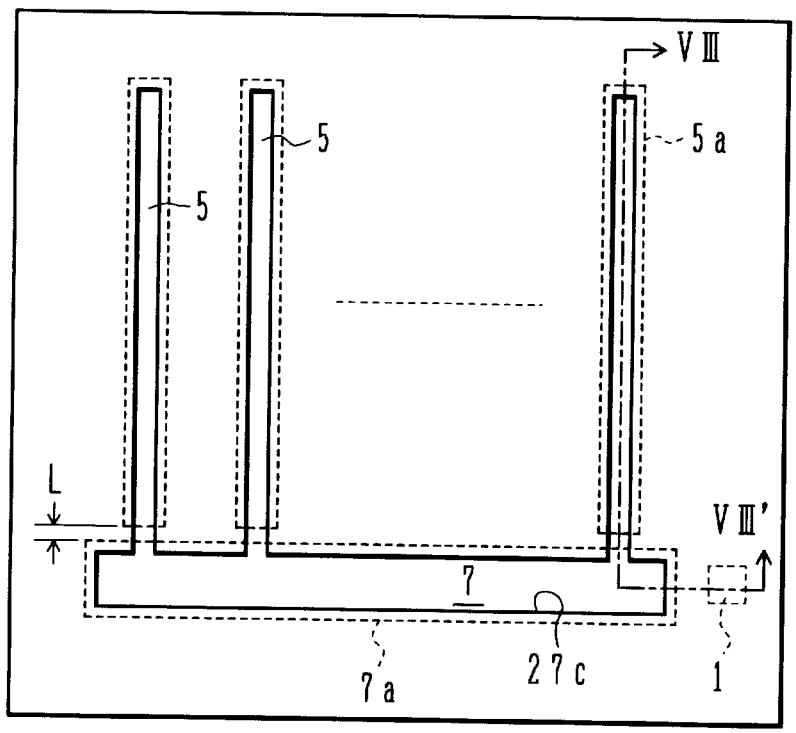

As shown in FIGS. 7E and 8D, a fourth resist mask R14 having a third opening 27c is formed by photolithography. The third opening 27c includes an area along the first p-type semiconductor layer 5a and an area along the second p-type semiconductor layer 7a, and is continuous covering the coupling area between the first and second p-type semiconductor layers 5a and 7a.

By using the fourth resist mask R14, n-type impurity ions, e.g., $P^+$, are implanted into the first and second p-type semiconductor layers 5a and 7a via the third opening 27c. This ion implantation is called a fourth ion implantation process.

For example, the $P^+$ ion implantation conditions for the fourth ion implantation process are a dose of $4 \times 10^{12}$ $cm^{-2}$ and an acceleration energy of 180 keV.

The effective depth (peak position of the n-type impurity concentration) of the n-type semiconductor layer constituting the vertical charge transfer channel layer 5 and horizontal charge transfer channel layer 7 is about 0.3 μm.

With reference to FIGS. 9 to 12, the solid state image pickup device manufactured by the above-described manufacture processes will be described.

Figure 9:
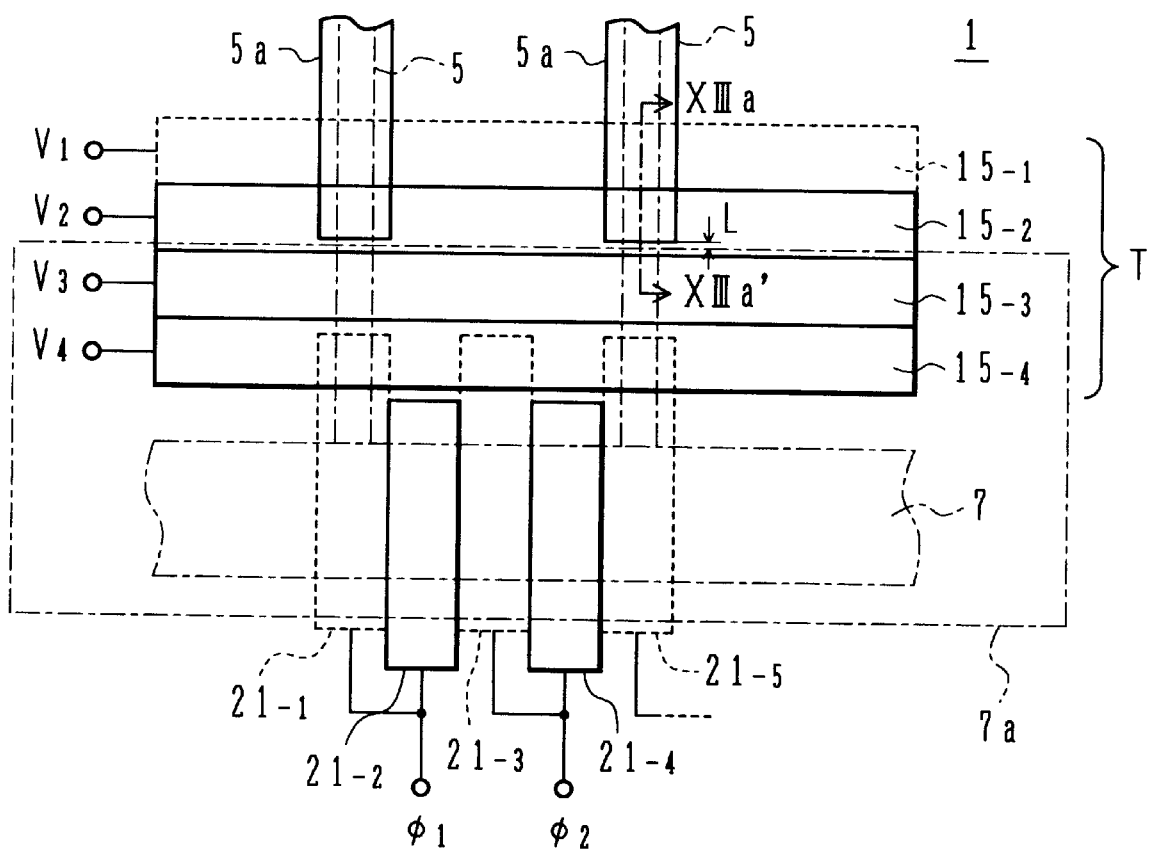
FIG. 9 is a plan view showing the structure of a charge transfer area of a solid state image pickup device according to an embodiment of the invention.

FIG. 9 is a schematic plan view mainly showing a charge transfer area of the solid state image pickup device for transferring electrons from the vertical charge transfer channels 5 to the horizontal charge transfer channel 7.

As shown in FIG. 9, on the vertical charge transfer channel layers 5 near the horizontal charge transfer channel layer 7, charge transfer electrodes 15-1 to 15-4 are disposed adjacent to each other toward the downstream side in this order. Voltages V1 to V4 are applied to the charge transfer electrodes 15-1 to 15-4. The charge transfer electrodes 15 and vertical charge transfer channel layers 5 constitute the charge transfer area T.

For example, in the area under the charge transfer electrode 15-2, downstream one ends of a plurality of first p-type semiconductor layers 5a are spaced by a distance L from the horizontally extending second p-type semiconductor layer 7a.

Figure 13:
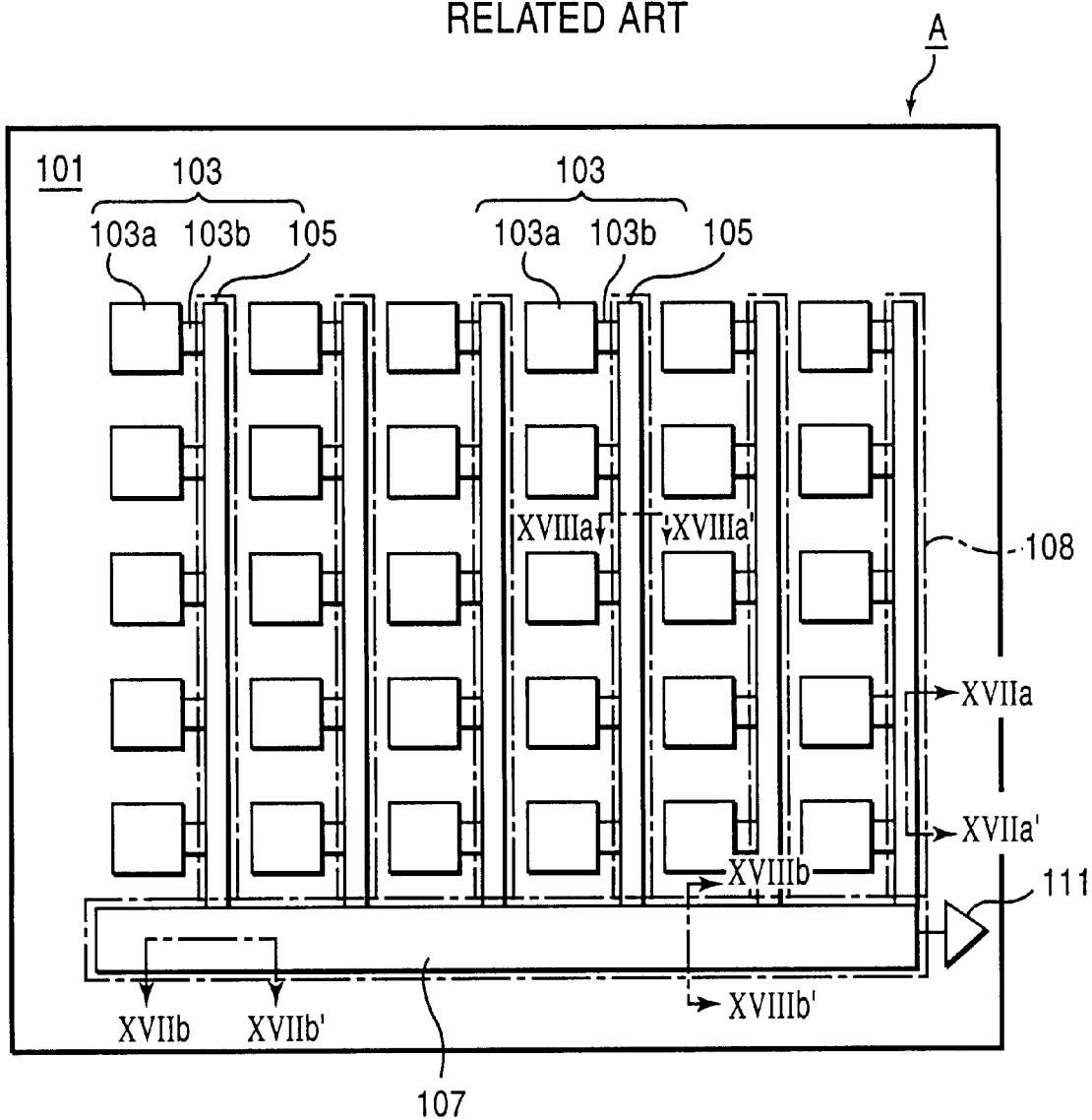
FIG. 13 is a plan view of a general interline solid state image pickup device.
Figure 14A:
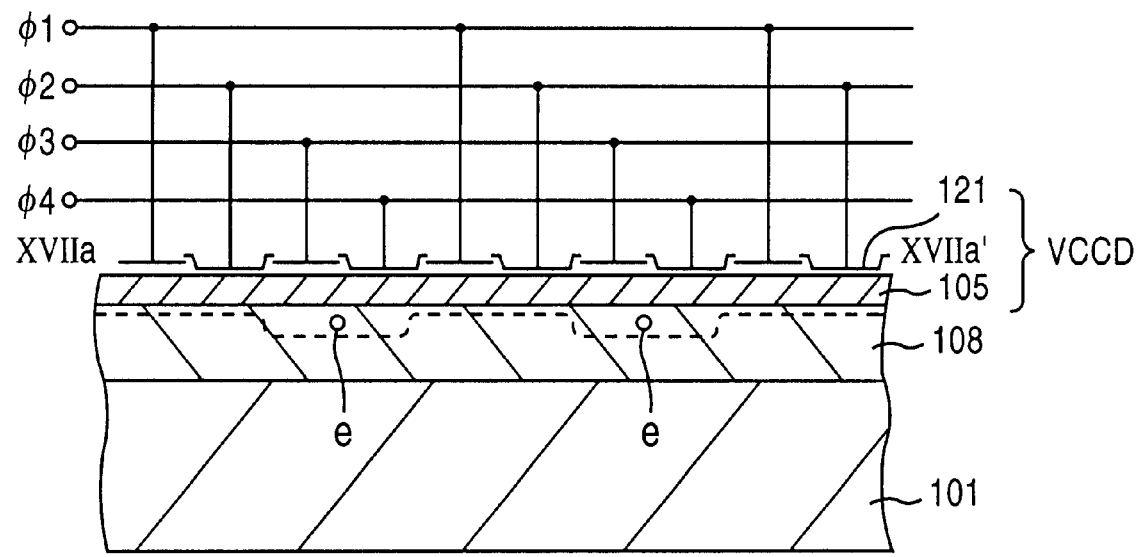
FIG. 14A is a cross sectional view showing the general structure of a vertical charge transfer path taken along line XVIIa–XVIIa' of FIG. 13.
Figure 14B:
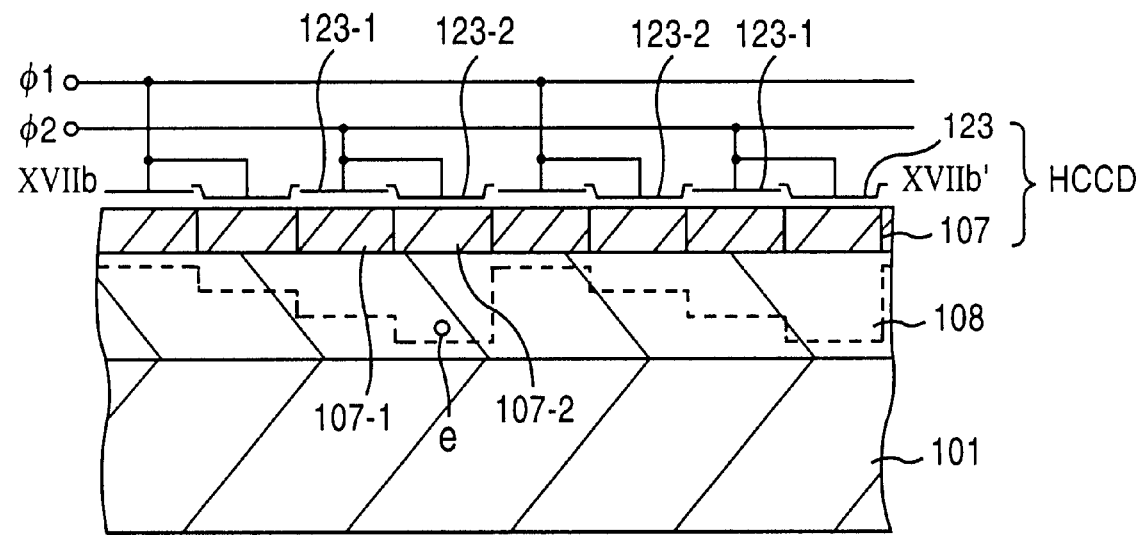
FIG. 14B is a cross sectional view showing the general structure of a horizontal charge transfer path taken along line XVIIb–XVIIb' of FIG. 13.
Figure 15A:
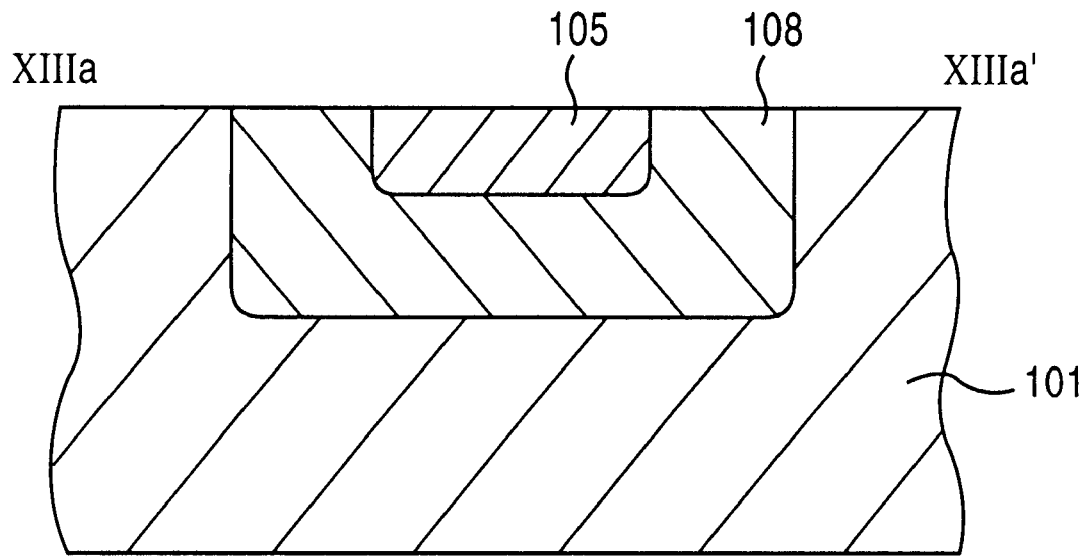
FIG. 15A is a schematic cross sectional view showing the structures of a vertical charge transfer channel layer and a p-type semiconductor layer, taken along line XVIIIa–XVIIIa' shown in FIG. 13.
Figure 15B:
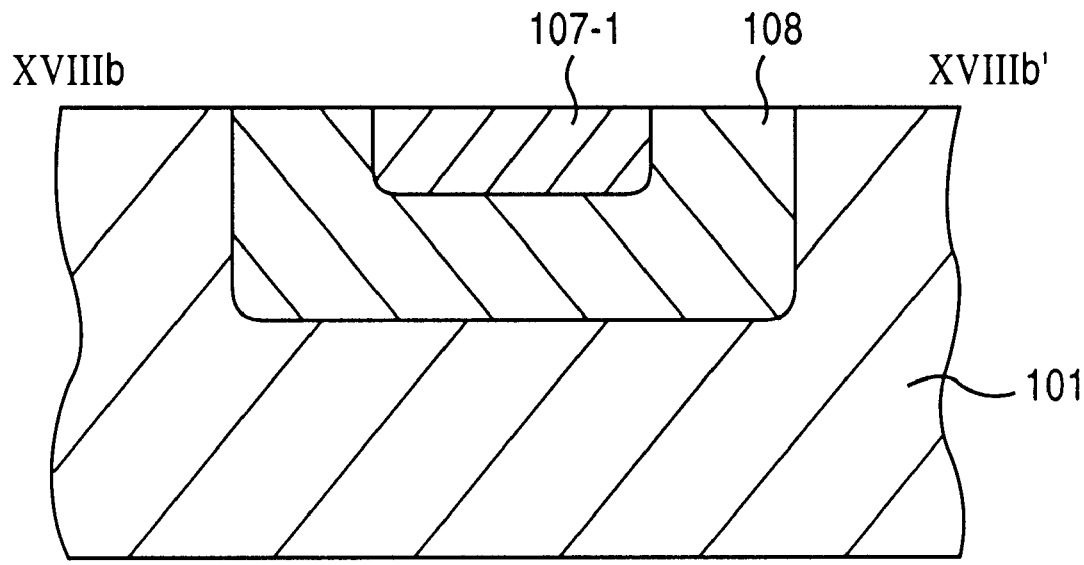
FIG. 15B is a schematic cross sectional view showing the structures of a horizontal charge transfer channel layer and a p-type semiconductor layer, taken along line XVIIIb–XVIIIb' shown in FIG. 13.

The third p-type semiconductor layer 41a (FIG. 13) is formed in an area between the downstream one ends of a plurality of first p-type semiconductor layers 5a and the horizontally extending second p-type semiconductor layer 7a. The third p-type semiconductor layer 41a may be formed also in a different area.

A positive voltage, e.g., 8 V, is sequentially applied to the charge transfer electrodes 15-1 to 15-4 in the charge transfer area T to transfer electrons from the vertical charge transfer channels 5 to the horizontal charge transfer channel 7 (from an upstream side to a downstream side).

The depth of the third p-type semiconductor layer 41a is set shallower than those of the first and second p-type semiconductor layers 5a and 7a. The charge transfer area T has a function of transferring electrons read from the photoelectric conversion elements and transferred from the vertical charge transfer channel layers 5 toward the horizontal charge transfer channel layer 7. In the charge transfer area T, a high voltage, e.g., 15 V, for reading charges from the photoelectric conversion element to the vertical charge transfer channel layer 5, or a high voltage necessary for transferring electrons in the horizontal charge transfer path at high speed, is not used.

Therefore, in the charge transfer area T, the end of the depletion layer extending from the vertical charge transfer channel layer 5 does not extend deep into the n-type semiconductor layer 1, and electrons during transfer in the charge transfer area T are not hard to be pulled into the n-type semiconductor layer 1. The depth of the third p-type semiconductor layer 41a is not limited only to being shallow, depending upon the relation to the depths of the first and second p-type semiconductor layers 5a and 7a.

Figure 10:
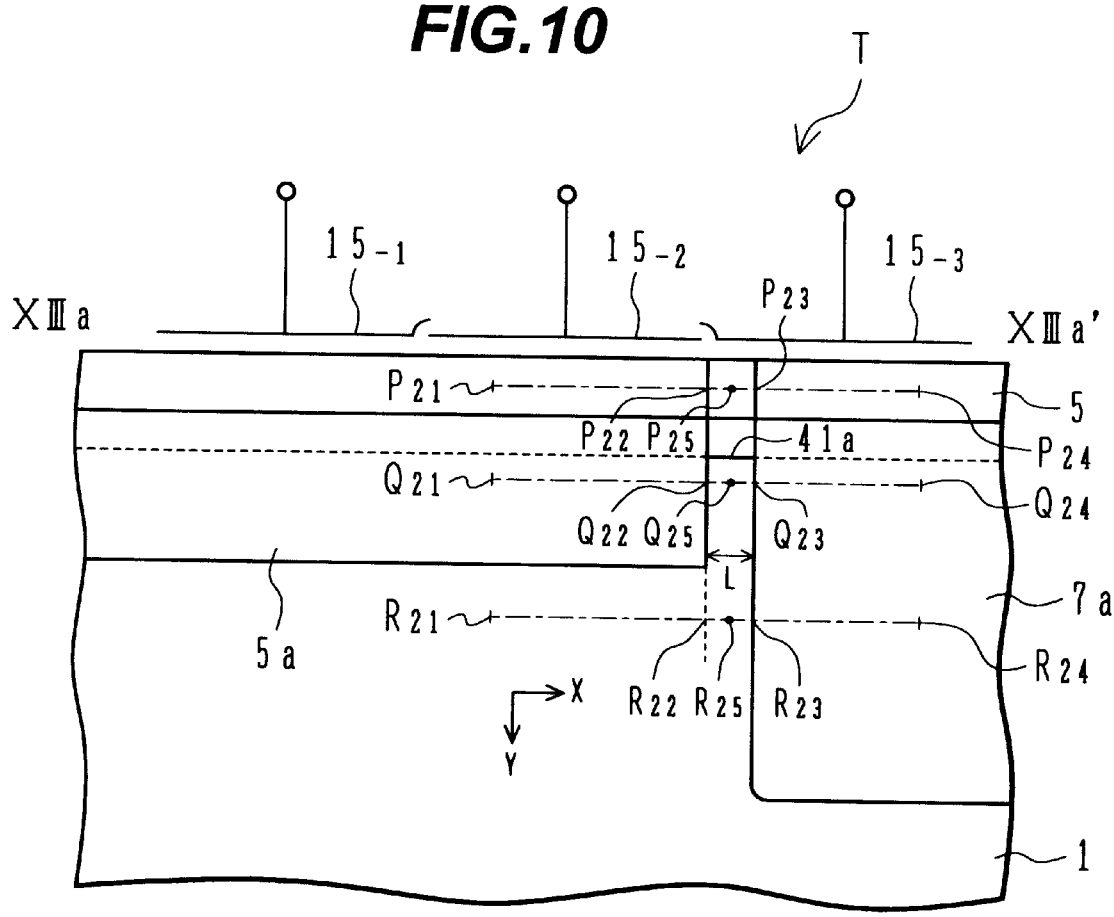
FIG. 10 is a cross sectional view of the solid state pickup device taken along line XIIIa–XIIIa' shown in FIG. 9.

FIG. 10 is a cross sectional view taken along line XIIIa–XIIIa' of FIG. 9.

As shown in FIG. 10, the third p-type semiconductor layer 41a between the first and second p-type semiconductor layers 5a and 7a is formed in an area (surrounded by a solid line) under the charge transfer electrode 15-3 near the charge transfer electrode 15-2.

In FIG. 10, P21 indicates a point in the vertical charge transfer channel layer 5 formed, in the first p-type semiconductor layer 5a. P24 indicates a point in the vertical charge transfer channel layer 5 formed in the second p-type semiconductor layer 7a. P22 and P23 indicate two points on a line interconnecting P21 and P24 crossing both ends of the third p-type semiconductor layer 41a, in the order from P21 side.

R21 indicates a point in the n-type semiconductor layer 1 under the first p-type semiconductor layer 5a at a depth shallower than the bottom of the second p-type semiconductor layer 7a. R23 indicates a point at which a line horizontally extending from R21 crosses the second p-type semiconductor layer 7a. R22 indicates a point at which a line vertically extending from P22 crosses the line horizontally extending from R21. R24 indicates a point in the second p-type semiconductor layer 7a. P25 indicates a point between P22 and P23.

Q21 indicates a point in the first p-type semiconductor layer 5a under the vertical charge transfer channel layer 5. Q24 indicates a point in the second p-type semiconductor layer 7a under the vertical charge transfer channel 5. Q22 and Q23 indicate two points on a line interconnecting Q21 and Q24 crossing both ends of the third p-type semiconductor layer 41a, in the order from P21 side. Q25 indicates a point between Q23 and Q24.

The structure of the solid state image pickup device shown in FIG. 10 will be detailed with reference to FIGS. 11A to 11C and FIG. 12.

Figure 11A:
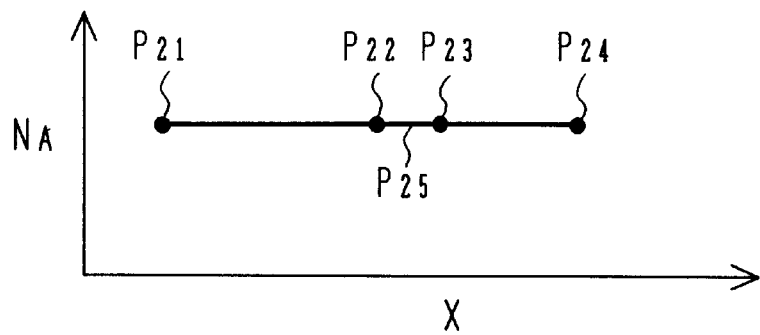
FIG. 11A shows a profile of a p-type impurity concentration along line P21–P24 shown in FIG. 9.

FIG. 11A shows a profile of p-type impurity concentration along a line P21–P24 shown in FIG. 10. FIG. 1B shows a profile of p-type impurity concentration along a line Q21–Q24 shown in FIG. 10. FIG. 11C shows a profile of p-type impurity concentration along a line R21–R24 shown in FIG. 10.

As shown in FIG. 11A, the p-type impurity concentration in the vertical charge transfer channel layer 5 is generally constant between P21 and P24 although it becomes slightly low between P22 and P23 (near P25).

The n-type impurity concentration in the vertical charge transfer channel layer 5 made of the n-type semiconductor layer doped with p-type impurities generally at a constant concentration is also almost constant.

Therefore, the n-type impurity concentrations of the vertical charge transfer channel layer 5 made of the third p-type semiconductor layer, and the vertical charge transfer channel layer 5 and horizontal charge transfer channel layer 7 respectively formed outside the former layer 5 are almost equal.

Figure 11B:
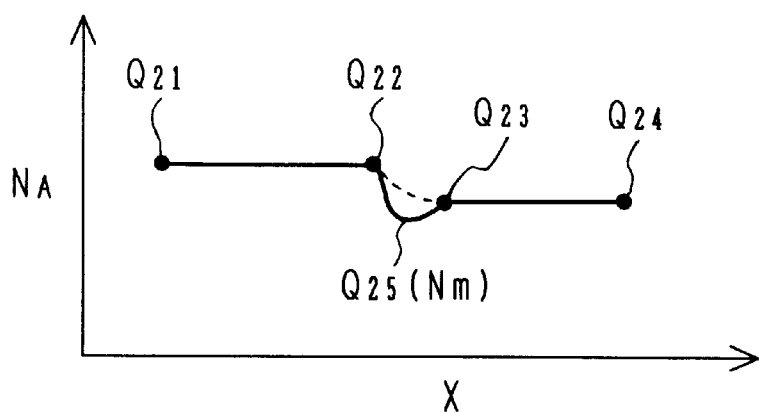
FIG. 11B shows a profile of a p-type impurity concentration along line Q21—Q21 shown in FIG. 9.
Figure 11C:
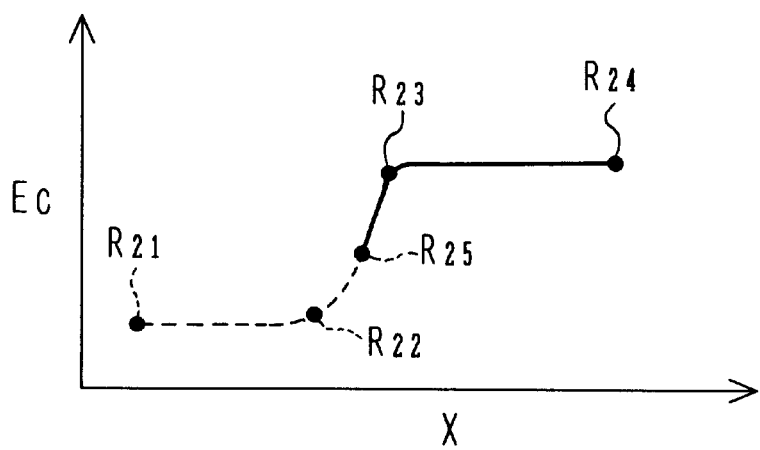
FIG. 11C shows a profile of a p-type impurity concentration along line R21–R24 shown in FIG. 9.

As shown in FIG. 11B, the p-type impurity concentration is generally constant between Q21 and Q22 and the p-type impurity concentration is also generally constant between Q23 and Q24. The p-type impurity concentration between Q22 and Q23 is lower than the p-type impurity concentrations between Q21 and Q22 and between Q23 and Q24. The p-type impurity concentration between Q22 and Q23 shows, for example, a downward convex curve having a minimum p-type impurity concentration Nm at Q23. The p-type concentration of the third p-type semiconductor layer 41a (FIG. 10) is lower than a higher one of the p-type impurity concentrations of the first and second p-type semiconductor layers 5a and 7a (FIG. 10).

An area having the minimum concentration has practically some width in some cases. The p-type impurity concentration gradually lowers from Q22 to Q25 and from Q23 to Q25.

From the viewpoint of electron transfer efficiency, it is preferable that the p-type impurity concentration between Q22 and Q23 lowers monotonously as 15 indicated by a broken line in FIG. 11B without having the minimum value Nm. In this case, an impurity concentration gradient layer is formed between Q22 and Q23, from the region Q21–Q22 having a higher p-type impurity concentration toward the region Q23–Q24 having a lower p-type impurity concentration. It is preferable in this case that the p-type impurity concentration of the p-type impurity gradient layer Q22–Q23 is lower than a higher one of the impurity concentrations of the first and second p-type semiconductor layers 5a and 7a (FIG. 10). Since a potential barrier is not formed in the path Q21–Q24, electrons can be transferred smoothly.

As shown in FIG. 11C, the p-type impurity concentration is generally constant between R23 and R24. The p-type impurity concentration lowers greatly from R23 to R2.2. The region R22–R21 shows the n-type impurity concentration in the n-type semiconductor layer 1 as indicated by a broken line in FIG. 11C.

Electrons are generally transferred in the charge transfer area T in a depth range from line P21–P24 shown in FIG. 11A to line Q21–Q24 shown in FIG. 11B, from the vertical charge transfer channel layer 5 to the horizontal charge transfer channel layer 7. As apparent from the comparison with FIGS. 6A to 6C, a potential barrier is not formed in this depth range, and electrons can be transferred more smoothly.

Figure 12:
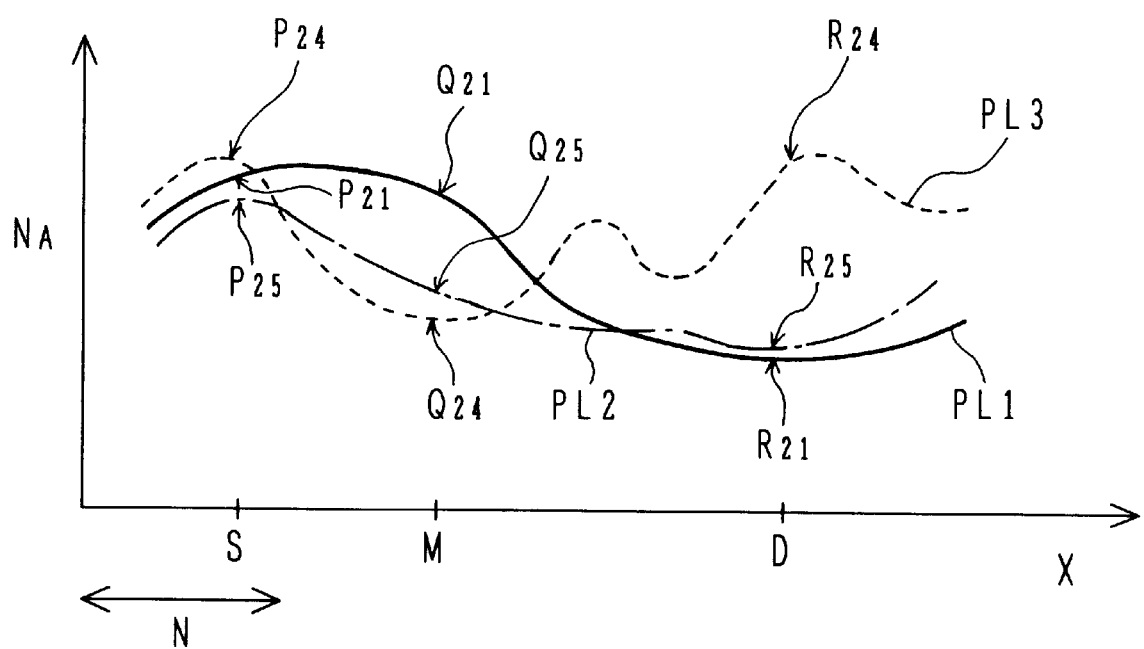
FIG. 12 shows profiles of p-type impurity concentrations in a depth direction of a solid state image pickup device according to an embodiment of the invention.

FIG. 12 briefly shows profiles of p-type impurity concentrations along the y-direction or depth direction.

FIG. 12 shows a p-type impurity concentration profile PL1 along line P21-Q21-R21 shown in FIG. 10, a p-type impurity concentration profile PL2 along line P25-Q25-R25, a p-type impurity concentration profile PL3 along line P24-Q24-R24.

At a shallow position S in the depth direction (y-direction), the p-type impurity concentrations do not change greatly at each of points P21, P25 and P24. At a middle depth position M, the p-type impurity concentration at point Q21 in the first p-type semiconductor layer is higher than the p-type impurity concentrations at points Q24 and Q25 respectively in the second and third p-type semiconductor layers 7a and 41a. At a deep position D, the p-type impurity concentration at point R24 in the second p-type semiconductor layer 7a is high.

As shown in FIG. 10, the position of point Q25 is deeper than the third p-type semiconductor layer 41a indicated by the solid line. In this embodiment, the depth of each of the first to third p-type semiconductor layers is defined by the peak of the p-type impurity concentration. Therefore, a region deeper than the peak position also exhibits a p-type conductivity type.

The p-type impurity concentration at Q21 in the first p-type semiconductor layer is set high at a middle depth position M, and the p-type impurity concentration at R21 in the first p-type semiconductor layer 5a is set low at the deep position D to exhibit an n-type conductivity type. This setting is to prevent generation of smear.

More specifically, since the vertical charge transfer channel layer 5 is formed between adjacent photoelectric conversion element columns, stray light may enter from the aperture of each photoelectric conversion element into the vertical charge transfer channel layer 5 or first p-type semiconductor layer 5a. Unnecessary charges (electrons) generated by stray light are drained to the n-type semiconductor layer 1 to prevent generation of smear.

A solid state image pickup device has generally a so-called electronic shutter which drains electrons accumulated in each photoelectric conversion element to the n-type semiconductor layer 1 by applying a potential called a substrate bias potential between the n-type semiconductor layer 1 and first p-type semiconductor layer 5a.

Even if the electronic shutter is turned on, i.e., even if a large positive voltage is applied to the n-type semiconductor layer 1 relative to the upper first p-type semiconductor layer 5a, the width of a depletion layer between the n-type semiconductor layer 1 and first p-type semiconductor layer 5a does not change greatly because there is the peak of the p-type impurity concentration at the depth position M.

Therefore, the potential of the vertical charge transfer channel layer 5 formed in the first p-type semiconductor layer 5a does not change greatly.

The p-type impurity concentration of the second p-type semiconductor layer 7a at the depth position M is rather low as indicated at point Q24. At this position M, a depletion layer is likely to extend to the second p-type semiconductor layer 7a when a voltage is applied to the horizontal charge transfer channel layer 7.

This extended depletion layer suppresses a large change in potentials of the horizontally adjacent charge transfer electrodes of the horizontal charge transfer path. This gradually changing fringing field makes the potential energy become lower toward the electron transfer direction in the horizontal charge transfer path and generate an electric field. This electric field helps electrons transfer in the horizontal charge transfer path at high speed.

The second p-type semiconductor layer 7a has a high peak of the p-type impurity concentration at the depth position D as indicated at R24. For example, this depth D is about six times as deeper as the depth S.

Therefore, even in the electronic shutter mode, the potential in the horizontal charge transfer channel layer 7 made of the second p-type semiconductor layer 7a does not change greatly.

The second p-type semiconductor layer 7a is formed deeper than the first p-type semiconductor layer 5a. Therefore, even if a voltage having a large amplitude is applied to the charge transfer electrode in order to speed up the transfer speed of electrons in the horizontal charge transfer channel layer 7, there is only a small possibility that the end of a depletion layer reaches the interface between the second p-type semiconductor layer 7a of the horizontal charge transfer channel and the n-type semiconductor layer. A possibility that electrons transferred in the horizontal charge transfer channel layer 7a at high speed upon application of a high voltage enters the n-type semiconductor layer 1 can therefore be reduced.

The distance Lm between one end (first position x1) of the first opening 27a shown in FIG. 7C and an opposing one end (second position x2) of the second opening 27b shown in FIG. 7D becomes slightly different from the distance L between the borders of the first and second p-type semiconductor layers 5a and 7a of an actually manufactured slid state image pickup device.

The distance L and distance Lm become different even if there is no mask misalignment, because of lateral diffusion of implanted ions. Namely, p-type impurity ions implanted into semiconductor diffuse laterally from the mask opening and further diffuse during a later activation annealing process.

It is therefore necessary to take the following points into consideration when designing exposure glass masks for ion implantation photoresist patterns and the like and determining the distance Lm.

It is preferable that the distance L is ideally 0. However, since there are a margin of mask alignment and influence of impurity diffusion by heat treatment, the distance L is in a range from about 0.1 μm to 0.5 μm, or preferably about 0.3 μm.

The distance Lm is longer than the distance L. The distance Lm is preferably in a range from 0.5 μm to 1.0 μm, e.g., about 0.7 μm, although it depends on the ion implantation conditions.

As described so far, according to the solid state image pickup device of this embodiment, the second p-type semiconductor layer is formed deeper than the first p-type semiconductor layer. Accordingly, the amplitude of a voltage to be applied to the charge transfer electrode of the horizontal charge transfer path can be made large, and the change transfer speed (transfer efficiency) of the horizontal charge transfer channel layer can be improved.

In the region where charges are transferred from the vertical charge transfer channel layers to the horizontal charge transfer channel layer, the first and second p-type semiconductor layers are formed spaced apart by a predetermined distance, the first and second p-type semiconductor layers are not overlapped and a potential barrier or the like is hard to be formed.

The transfer efficiency of charges from the vertical charge transfer channel layers to the horizontal charge transfer channel layer is therefor prevented from being lowered.

In the above embodiment, a solid state image pickup device having pixels of generally a square shape is used. The shape of a pixel (photoelectric conversion element) may be a regular hexagon, a square whose diagonal lines are aligned along vertical and horizontal directions, or the like.

A solid state image pickup device of a so-called pixel shift type may also be used in which horizontally disposed adjacent pixels are shifted by a half of the pixel pitch in the vertical direction.

The present invention has been described in connection with the preferred embodiments. The invention is not limited only to the above embodiments. It is apparent that various modifications, improvements, combinations, and the like can be made by those skilled in the art.

What is claimed is:

1. A solid state image pickup device comprising:

a semiconductor substrate;

a semiconductor layer of a first conductivity type formed in said semiconductor substrate;

a plurality of photoelectric conversion elements formed in said semiconductor layer regularly in vertical and horizontal directions;

a plurality of first semiconductor layers of a second conductivity type opposite to the first conductivity type, said first semiconductor layer being formed in said semiconductor layer along a photoelectric conversion element column having said photoelectric conversion elements regularly disposed in the vertical direction, and extending in the vertical direction and protruding from the photoelectric conversion element column;

a second semiconductor layer of the second conductivity type formed in said semiconductor layer, said second semiconductor layer extending in the horizontal direction and having an opposing side which is positioned near at one end of the photoelectric conversion element column of each of said first semiconductor layers and faces the one end spaced by a distance L from the one end;

a horizontal charge transfer channel layer of the first conductivity type formed in said second semiconductor layer and extending in the horizontal direction;

a plurality of vertical charge transfer channel layers of the first conductivity type each extending in the vertical direction in a corresponding one of said first semiconductor layers toward said horizontal charge transfer channel layer and protruding from the one end to couple said horizontal charge transfer channel layer; and a third semiconductor layer of the second conductivity type formed between the one ends and the opposing side, said third semiconductor layer of the second conductivity type having an impurity concentration lower than a higher one of impurity concentrations of said first and second semiconductor layers of the second conductivity type.

2. A solid state image pickup device according to claim 1, wherein said second semiconductor layer of the second conductivity type is formed deeper than said first semiconductor layer of the second conductivity type.

3. A solid state image pickup device according to claim 1, wherein an impurity concentration of said third semiconductor layer of the second conductivity type is lower than impurity concentrations of said first and second semiconductor layers of the second conductivity type, in a region having a constant depth from a surface of said semiconductor substrate.

4. A solid state image pickup device according to claim 1, wherein the distance L is in a range from 0.1 μm to 0.5 μm.

5. A solid state image pickup device according to claim 1, wherein said third semiconductor layer includes an impurity concentration gradient layer of the second conductivity type whose impurity concentration is gradient from the one end to the opposing side or from the opposing side to the one end.

6. A solid-state image pickup device according to claim 1, wherein said third semiconductor layer of the second conductivity type is formed shallower than said first and second semiconductor layers of the second conductivity type.

7. A solid state image pickup device according to claim 1, wherein said second semiconductor layer of the second conductivity type has a plurality of peaks of an impurity concentration along a depth direction.

8. A solid state image pickup device according to claim 1, wherein said second semiconductor layer of the second conductivity type has a peak of an impurity concentration at a position deeper than said first semiconductor layer of the second conductivity type.

* * * * *